United States Patent
Park et al.

(10) Patent No.: US 9,431,062 B2
(45) Date of Patent: Aug. 30, 2016

(54) NONVOLATILE MEMORY DEVICE AND METHOD OF DRIVING WORD LINE OF THE NONVOLATILE MEMORY

(71) Applicants: Sang-Won Park, Seoul (KR); Kitae Park, Seongnam-Si (KR); Sang-Won Shim, Seoul (KR)

(72) Inventors: Sang-Won Park, Seoul (KR); Kitae Park, Seongnam-Si (KR); Sang-Won Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/567,652

(22) Filed: Dec. 11, 2014

(65) Prior Publication Data

US 2015/0221351 A1    Aug. 6, 2015

(30) Foreign Application Priority Data

Feb. 3, 2014  (KR) ........................ 10-2014-0012171

(51) Int. Cl.
| | |
|---|---|
| G11C 16/26 | (2006.01) |
| G11C 16/10 | (2006.01) |
| G11C 16/08 | (2006.01) |
| G11C 16/30 | (2006.01) |
| G11C 16/32 | (2006.01) |
| G11C 5/02 | (2006.01) |
| G11C 8/08 | (2006.01) |
| G11C 7/04 | (2006.01) |
| G11C 11/56 | (2006.01) |
| G11C 16/04 | (2006.01) |

(52) U.S. Cl.
CPC . *G11C 5/02* (2013.01); *G11C 8/08* (2013.01); *G11C 16/08* (2013.01); *G11C 7/04* (2013.01); *G11C 11/5628* (2013.01); *G11C 11/5642* (2013.01); *G11C 16/0483* (2013.01); *G11C 16/10* (2013.01); *G11C 16/30* (2013.01); *G11C 16/32* (2013.01)

(58) Field of Classification Search
CPC .............. G11C 16/10; G11C 16/0483; G11C 11/5642; G11C 11/5628; G11C 16/30; G11C 16/32
USPC ............. 365/185.17, 185.18, 185.19, 185.23
See application file for complete search history.

(56) References Cited

U.S. PATENT DOCUMENTS

| | | | |
|---|---|---|---|
| 6,259,631 | B1 | 7/2001 | Menichelli et al. |
| 6,798,275 | B1 | 9/2004 | Le et al. |
| 7,656,713 | B2 | 2/2010 | Cernea |
| 8,018,777 | B2 | 9/2011 | Kang |
| 8,120,953 | B2 | 2/2012 | Tanaka |
| 8,179,723 | B2 | 5/2012 | Mokhlesi |
| 8,203,888 | B2 | 6/2012 | Fukuda et al. |
| 8,300,459 | B2 | 10/2012 | Tsao et al. |
| 8,427,876 | B2 | 4/2013 | Takekida |
| 8,520,441 | B2 | 8/2013 | Yuh |

(Continued)

FOREIGN PATENT DOCUMENTS

KR    10-2010-0067598 A    6/2010

*Primary Examiner* — Ly D Pham
(74) *Attorney, Agent, or Firm* — Volentine & Whitt, PLLC

(57) ABSTRACT

A word line driving method is for a nonvolatile memory device including a plurality of memory blocks having a plurality of strings which is formed in a direction perpendicular to a substrate and connected between bit lines and a common source line. The method includes applying an offset pulse to a word line for a predetermined time to shorten a word line setting time, and applying a target pulse having a level which is higher or lower than a level of the offset pulse to the word line after the predetermined time.

19 Claims, 23 Drawing Sheets

(56) References Cited

U.S. PATENT DOCUMENTS

| | | |
|---|---|---|
| 8,526,233 B2 | 9/2013 | Hemink et al. |
| 8,559,222 B1 | 10/2013 | Iwai et al. |
| 8,559,229 B2 | 10/2013 | Kim et al. |
| 2010/0250410 A1 | 9/2010 | Song et al. |
| 2011/0122692 A1* | 5/2011 | Dutta .................. G11C 11/5628 365/185.03 |
| 2013/0094304 A1 | 4/2013 | Ahn |
| 2013/0308389 A1 | 11/2013 | Yuh |
| 2014/0160848 A1* | 6/2014 | Dutta ..................... G11C 16/10 365/185.17 |
| 2014/0241069 A1* | 8/2014 | Kwak ................... G11C 16/26 365/185.22 |
| 2015/0070998 A1* | 3/2015 | Dong ..................... G11C 16/26 365/185.17 |

\* cited by examiner

NONVOLATILE MEMORY DEVICE AND METHOD OF DRIVING WORD LINE OF THE NONVOLATILE MEMORY

CROSS-REFERENCE TO RELATED APPLICATIONS

A claim of priority under 35 U.S.C. §119 is made to Korean Patent Application No. 10-2014-0012171, filed on Feb. 3, 2014, the entire contents of which are hereby incorporated by reference.

BACKGROUND

The present inventive concept herein relates to a nonvolatile memory device and a method of driving a word line of the nonvolatile memory device.

A semiconductor memory device is generally classified as either a volatile semiconductor memory device or a nonvolatile semiconductor memory device. In contrast to a volatile memory device, a nonvolatile semiconductor memory device can retain stored data even when its power supply is interrupted. Data stored in a nonvolatile semiconductor memory device is reprogrammable or permanent depending on a manufacturing technology. A nonvolatile semiconductor memory device is used to store user data, program and a micro code in a wide range of applications such as in computer, avionics, communications, and consumer electronics industries.

SUMMARY

Embodiments of the inventive concept provide a nonvolatile memory device. The nonvolatile memory device may include a memory cell array including a plurality of memory blocks having a plurality of strings which is formed in a direction perpendicular to a substrate and connected between bit lines and a common source line, an address decoder selecting one of the memory blocks in response to an address, an input/output circuit storing data to be programmed in memory cells connected to a selected word line among word lines of the selected memory block in a program operation or storing data read from memory cells connected to the selected word line in a read or verify operation, a voltage generation circuit generating word line voltages applied to the selected word line and unselected word lines, and control logic controlling the address decoder, the input/output circuit and the voltage generation circuit in the program operation, the read operation and the verify operation. At least one of the word line voltages comprises an offset pulse and a target pulse and the offset pulse comprises an offset which is higher or lower a level of the target pulse for a predetermined time to shorten a word line setting time.

Embodiments of the inventive concept also provide a word line driving method of a nonvolatile memory device including a plurality of memory blocks having a plurality of strings which is formed in a direction perpendicular to a substrate and connected between bit lines and a common source line. The word line driving method may include applying an offset pulse to a word line for a predetermined time to shorten a word line setting time, and applying a target pulse having a level which is higher or lower than a level of the offset pulse to the word line after the predetermined time. The target pulse is one of a program voltage, a pass voltage, a read pass voltage, a read voltage and a verify voltage depending on an operation mode of the nonvolatile memory device.

Embodiments of the inventive concept also provide a storage device. The storage device may include at least one nonvolatile memory device generating a word line voltage having an offset pulse and a target pulse, wherein the offset pulse is applied to a word line at a level which is higher or lower than a level of the target pulse for a predetermined time before the target pulse is applied to the word line, and a memory controller controlling the at least one nonvolatile memory device and generating offset pulse setting information on the basis of one or more environmental information. The environmental information may include at least one of a number of program loops, an operation mode, pass/fail information of a specific program state, state information, temperature information, a program/erase cycle, information about degree of the number of operations, information about a physical structure of a word line, location information, address information, selection/non-selection information, time information, and so on. An offset corresponding to a difference between the level of the offset pulse and the level of the target pulse, and the predetermined time are changed by the offset pulse setting information.

BRIEF DESCRIPTION OF THE FIGURES

Preferred embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF EMBODIMENTS

Figure 1:
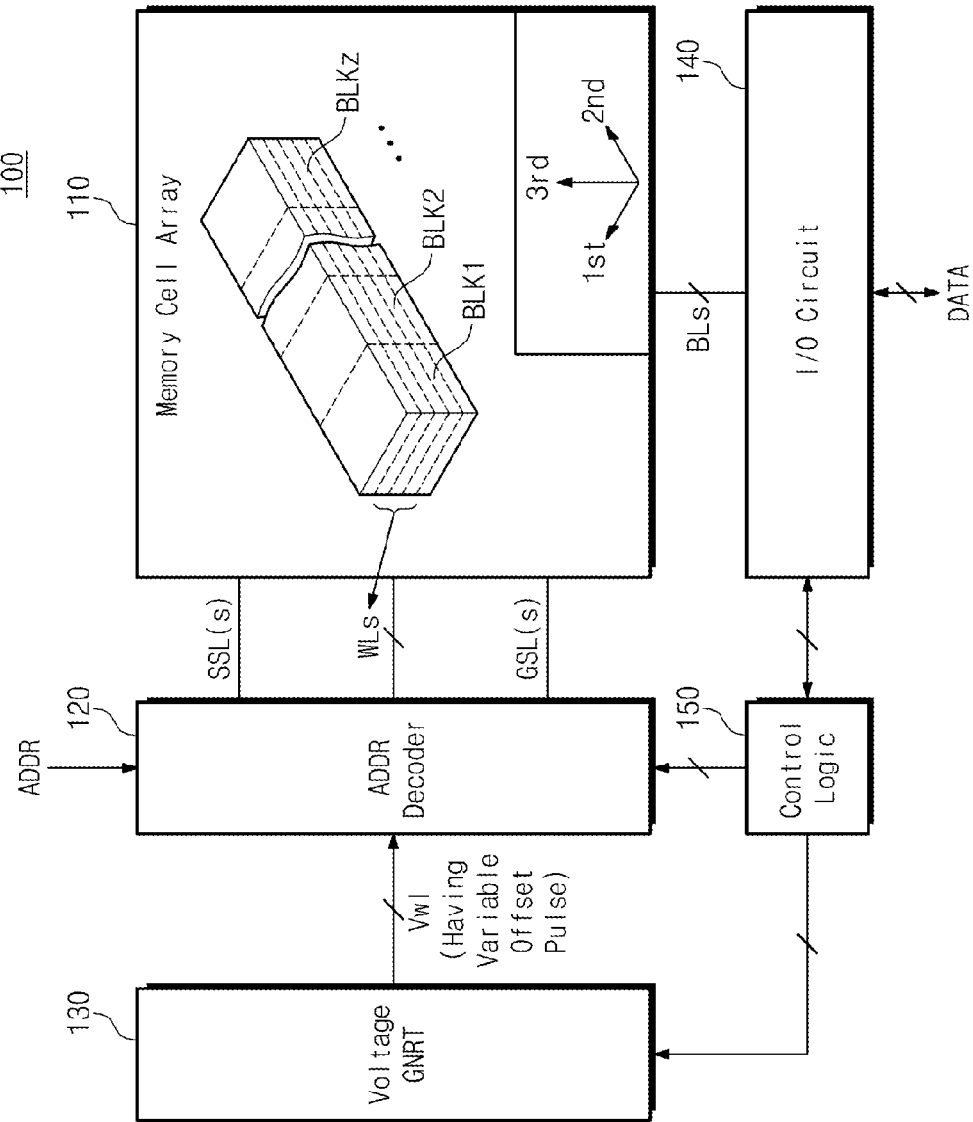
FIG. 1 is a drawing illustrating a nonvolatile memory device in accordance with an embodiment of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a drawing illustrating a nonvolatile memory device in accordance with an embodiment of the inventive concept. Referring to FIG. 1, a nonvolatile memory device 100 includes a memory cell array 110, an address decoder 120, a voltage generation circuit 130, an input/output circuit 140 and control logic 150.

The nonvolatile memory device 100 may be a NAND flash memory, a vertical NAND flash memory (VNAND), a NOR flash memory, a resistive random access memory (RRAM), a phase change memory (PRAM), a magnetoresistive random access memory (MRAM), a ferroelectric random access memory (FRAM), a spin transfer torque random access memory (STT-RAM), etc. The nonvolatile memory device 100 can be embodied by a three-dimensional array structure. The inventive concept can be applied to not only a flash memory device of which a charge storage layer is constituted by a conductive floating gate but also a charge trap flash (CTF) of which a charge storage layer is constituted by an insulating layer. For convenience of description, it is assumed that the nonvolatile memory device 100 is a vertical NAND type flash memory device VNAND.

The memory cell array 110 includes a plurality of memory blocks BLK1~BLKz (z is an integer of 2 or more). Each memory block is connected to the address decoder 120 through word lines WLs, at least one string select line SSL and at least one ground select line GSL, and is connected to the input/output circuit 140 through bit lines BLs. The word lines WLs may be a stacked plate-like shape structure.

Each memory block includes a plurality of strings with three-dimensional structure arranged along a first direction and a second direction different from the first direction on a substrate and arranged in a third direction perpendicular to the substrate. Each string is constituted by at least one string select transistor serially connected between a bit line BL and a common source line CSL, a plurality of memory cells and at least one ground select transistor. Each memory cell can store at least one bit. At least one dummy cell may be included between at least one string select transistor and the memory cells. At least one dummy cell may be included between the memory cells and at least one ground select transistor.

The address decoder 120 can select one of the memory blocks BLK1~BLKz in response to an address. The address decoder 120 is connected to the memory cell array 110 through word lines WLs, at least one string select line SSL and at least one ground select line GSL. The address decoder 120 selects the word lines WLs, the string select line SSL and the ground select line GSL using a decoded row address. The address decoder 120 can decode a column address among the inputted addresses. The decoded column address is transmitted to the input/output circuit 140. The address decoder 120 may include a row decoder, a column decoder, an address buffer, etc.

The voltage generation circuit 130 can generate voltages (a program voltage, a pass voltage, a read voltage, a read pass voltage, a verification voltage, an erase voltage, a common source line voltage, a well voltage) necessary for a drive. The voltage generation circuit 130 can generate a word line voltage Vwl necessary for a program operation/a read operation/an erase operation. The word line voltage Vwl may include a variable offset pulse for shortening setting time. The offset pulse has an offset higher or lower than a level (hereinafter it is referred to as 'target level') of a normal voltage of a word line voltage Vwl needed to drive a word line.

The voltage generation circuit 130 can selectively generate a word line voltage Vwl having an offset pulse under the control of the control logic 150. That is, the voltage generation circuit 130 may generate a word line voltage Vw1 having an offset pulse or may generate a word line voltage not having an offset pulse.

The voltage generation circuit 130 can change an offset of an offset pulse and generation time of an offset pulse.

The input/output circuit 140 is connected to the memory cell array 110 through bit lines BLs. The input/output circuit 140 is embodied to receive a decoded column address from the address decoder 120. The input/output circuit 140 can select bit lines BLs using the decoded column address.

The input/output circuit 140 includes a plurality of page buffers that stores data to be programmed in a program operation or data read in a read operation. Each page buffer may include a plurality of latches. In a program operation, data stored in the page buffers may be programmed in a page corresponding to a memory block selected through bit lines BLs. In a program operation, data read from a page corresponding to a select memory block may be stored in page buffers through bit lines BLs. The input/output circuit 140 can read data from a first area of the memory cell array 110 and store the read data in a second area of the memory cell array 110. For example, the input/output circuit 140 may be embodied to perform a copy-back.

The control logic 150 controls an overall operation (program/read/erase operations) of the nonvolatile memory device 100. The control logic 150 can operate in response to control signals or commands inputted from the outside. The control logic 150 controls the address decoder 120, the voltage generation circuit 130 and the input/output circuit 140 in program/read/erase operations.

The control logic 150 can control the voltage generation circuit 130 so that an offset or generation time of an offset pulse is changed by at least one environmental information such as the number of program loops, an operation mode, pass/fail information of a specific program state, state information, temperature information, a program/erase cycle, information about degree of the number of operations, information about a physical structure of a word line, location information, address information, selection/non-selection information, time information, etc. Environmental information about an offset and time of an offset pulse may be provided internally or from an external memory controller.

A general nonvolatile memory device has difference in setting time to reach a target level depending on a length between a voltage generation circuit and a word line when a word line voltage is applied. The difference of the setting time becomes an important factor of performance. For example, the worst word line setting time may become an important factor that determines overall operation time.

The nonvolatile memory device 100 of the inventive concept can greatly reduce word line loading time compared with that of a conventional nonvolatile memory device by applying a target pulse of a target level after applying an offset pulse having a level higher or lower than the target level when a word line voltage is applied. The reduction of the word line loading time may bring overall performance of the nonvolatile memory device 100.

Figure 2:
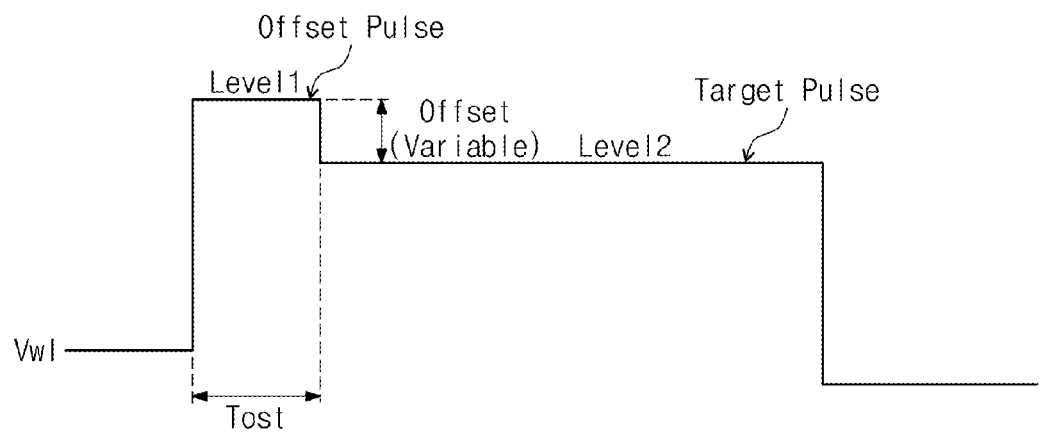
FIG. 2 is a drawing illustrating a first embodiment of a word line voltage Vw1 in accordance with an embodiment of the inventive concept.

FIG. 2 is a drawing illustrating a first embodiment of a word line voltage Vw1 in accordance with an embodiment of the inventive concept. Referring to FIG. 2, the word line voltage Vw1 may be divided into an offset pulse that occurs during offset time Tost and a target pulse that occurs after the offset time Tost goes by. As illustrated in FIG. 2, the offset pulse is a voltage of a level 1 and the target pulse is a voltage of a level 2. The level 1 is higher than the level 2 by an offset. The offset may be varied, changed, adjusted and controlled by environmental information. The level 2 is a target level of the word line voltage Vw1. The offset time Tost may be changed by environmental information.

In FIG. 2, the word line voltage Vw1 has an offset pulse higher than the target level during the offset time Tost. However, the offset pulse of the inventive concept does not need to be limited to the described example. The offset pulse of the inventive concept may be lower than the target level.

Figure 3:
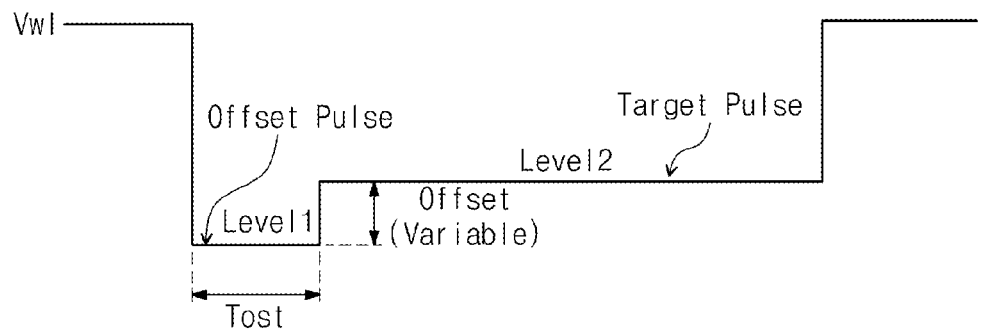
FIG. 3 is a drawing illustrating a second embodiment of a word line voltage Vw1 in accordance with an embodiment of the inventive concept.

FIG. 3 is a drawing illustrating a second embodiment of a word line voltage Vw1 in accordance with an embodiment of the inventive concept. Referring to FIG. 3, the word line voltage Vw1 may be divided into an offset pulse that occurs during offset time Tost and a target pulse that occurs after the offset time Tost goes by. As illustrated in FIG. 3, the offset pulse is a voltage of a level 1 and the target pulse is a voltage of a level 2. The level 1 is lower than the level 2 by an offset. The level 2 may be lower than 0V.

Figure 4:
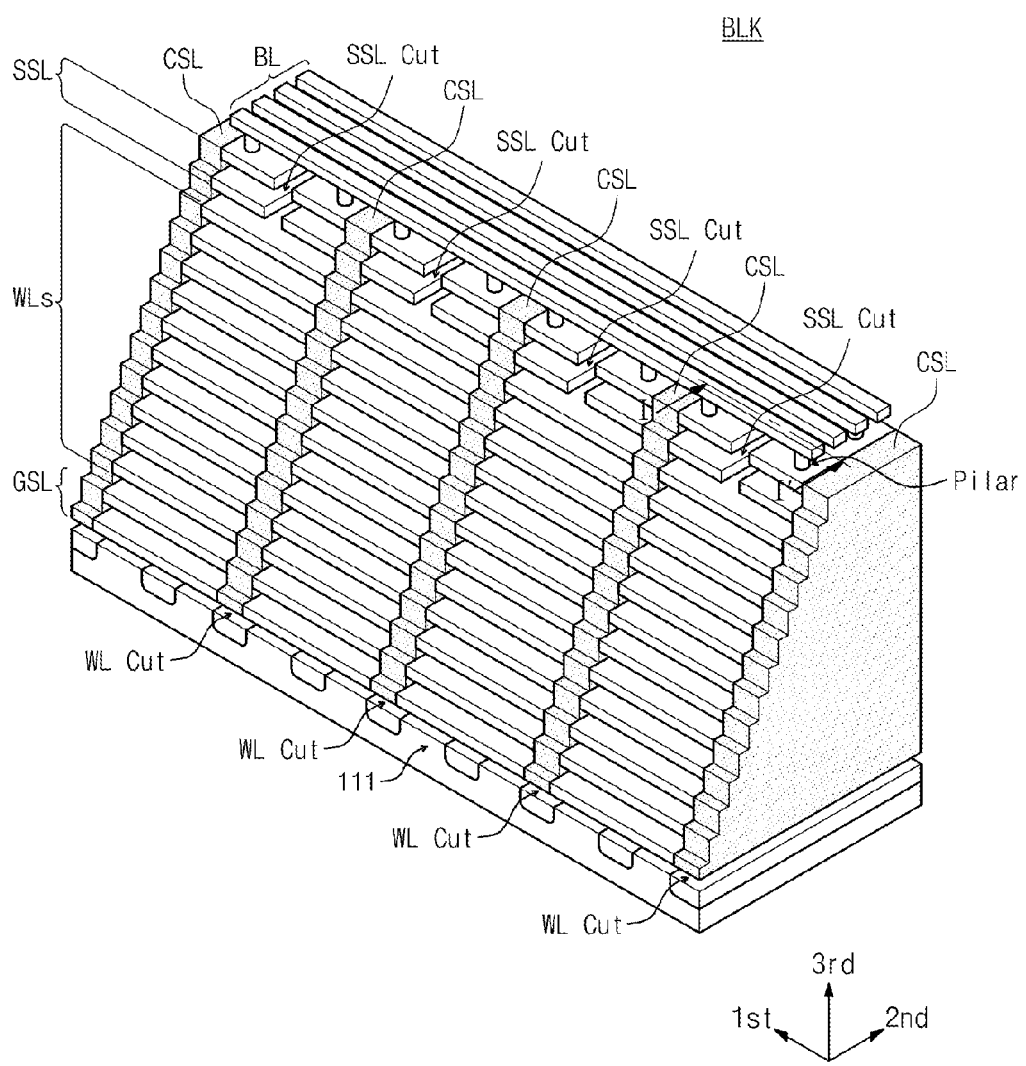
FIG. 4 is a drawing illustrating an example of a memory block illustrated in FIG. 1.

FIG. 4 is a drawing illustrating a memory block illustrated in FIG. 1. Referring to FIG. 4, four sub blocks are formed on a substrate 111. At least one ground select line GSL, a plurality of word lines WLs and at least one string select line SSL are stacked in a plate-like shape between word line cuts on a substrate to form each block. At least one string select line SSL is divided by a string select cut. A common source line CSL of a wall shape may be formed inside each word line cut.

At least one dummy word line may be stacked between the ground select line GSL and the word lines WLs and between the word lines WLs and the string select line SSL.

Although not illustrated in the drawing, each word line cut includes the common source line CSL. The common source lines CSL included in word line cuts are connected to a common line. A pillar connected to a bit line penetrates at least one ground select line GSL, a plurality of word lines WLs and at least one string select line SSL to form a string.

In FIG. 4, an object between the word line cuts is illustrated as a sub block but the inventive concept is not limited to the described example. In the inventive concept, an object between the word line cut and the string select line cut may be named a sub block.

The block BLK in accordance with embodiments of the inventive concept can be embodied by a structure that two word lines are merged into one, that is, a merged word line structure.

Figure 5:
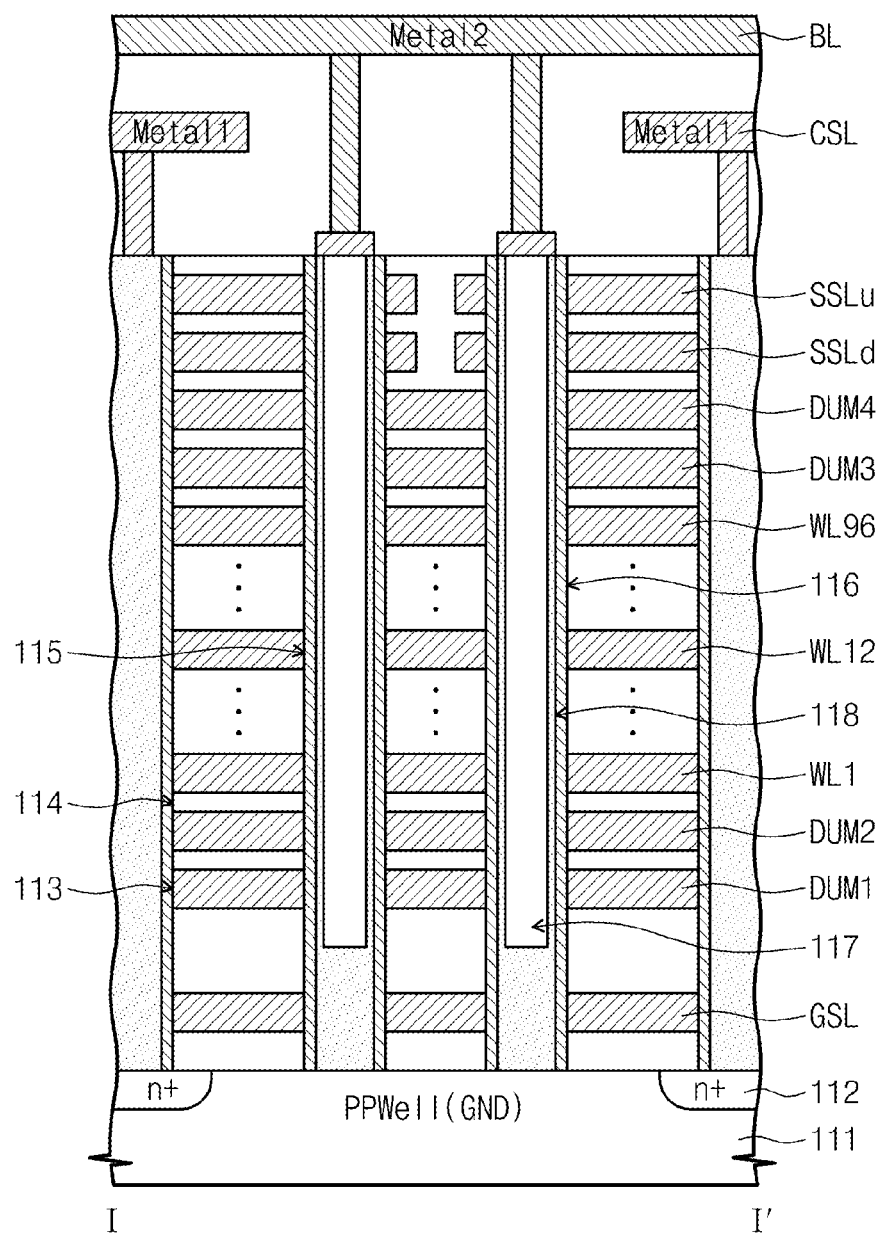
FIG. 5 is a drawing illustrating a part of a cross sectional view of the memory block illustrated in FIG. 4.

FIG. 5 is a drawing illustrating a part of a cross sectional view of the memory block illustrated in FIG. 4. Referring to FIG. 5, the memory block BLK is formed in a direction perpendicular to a substrate 111. An n+ doping region is formed in the substrate 111.

A gate electrode layer 113 and an insulating layer 114 are alternately deposited on the substrate 111. An information storage layer 115 may be formed on a side surface of the gate electrode layer 113 and the insulating layer 114.

The gate electrode layer 113 may be connected to a ground select line GSL, a plurality of word lines WL1~WL8 and a string select line SSL.

The information storage layer 115 may be constituted by a tunnel insulating layer, a charge storage layer and a blocking insulating layer. The tunnel insulating layer can be used as an insulating layer in which charges move by a tunneling effect. The charge storage layer may be constituted by an insulating layer trapping charges. The charge storage layer may be formed of, for example, a nitride layer SiN or a metal (aluminum or hafnium) oxide layer. The blocking insulating layer can operate as a string insulating layer. The blocking insulating layer may be formed of a silicon oxide layer. The tunnel insulating layer, the charge storage layer and the blocking insulating layer can be formed of an insulating layer of an oxide-nitride-oxide (ONO) structure.

A pillar 116 may be formed by pattering the gate electrode layer 113 and the insulating layer 114 in a vertical direction.

The pillar 116 penetrates the gate electrode layer 113 and the insulating layer 114 to be connected between a bit line and the substrate 111. The inside of the pillar 116 is a filing dielectric pattern 117 and may be formed an insulating material such as silicon oxide or an air gap. The outside of the pillar 116 is a vertical active pattern 118 and may be constituted by a channel semiconductor. The vertical active pattern 118 may be formed by a P type silicon layer. One memory cell included in a string may be constituted by the filing dielectric pattern 117, the vertical active pattern 118, the information storage layer 115 and the gate electrode layer 113 sequentially from the inside of the pillar 116.

Common source lines CSL extend on the n+ doping regions 112. The common source line CSL may be included inside a word line cut in a wall form.

Figure 6:
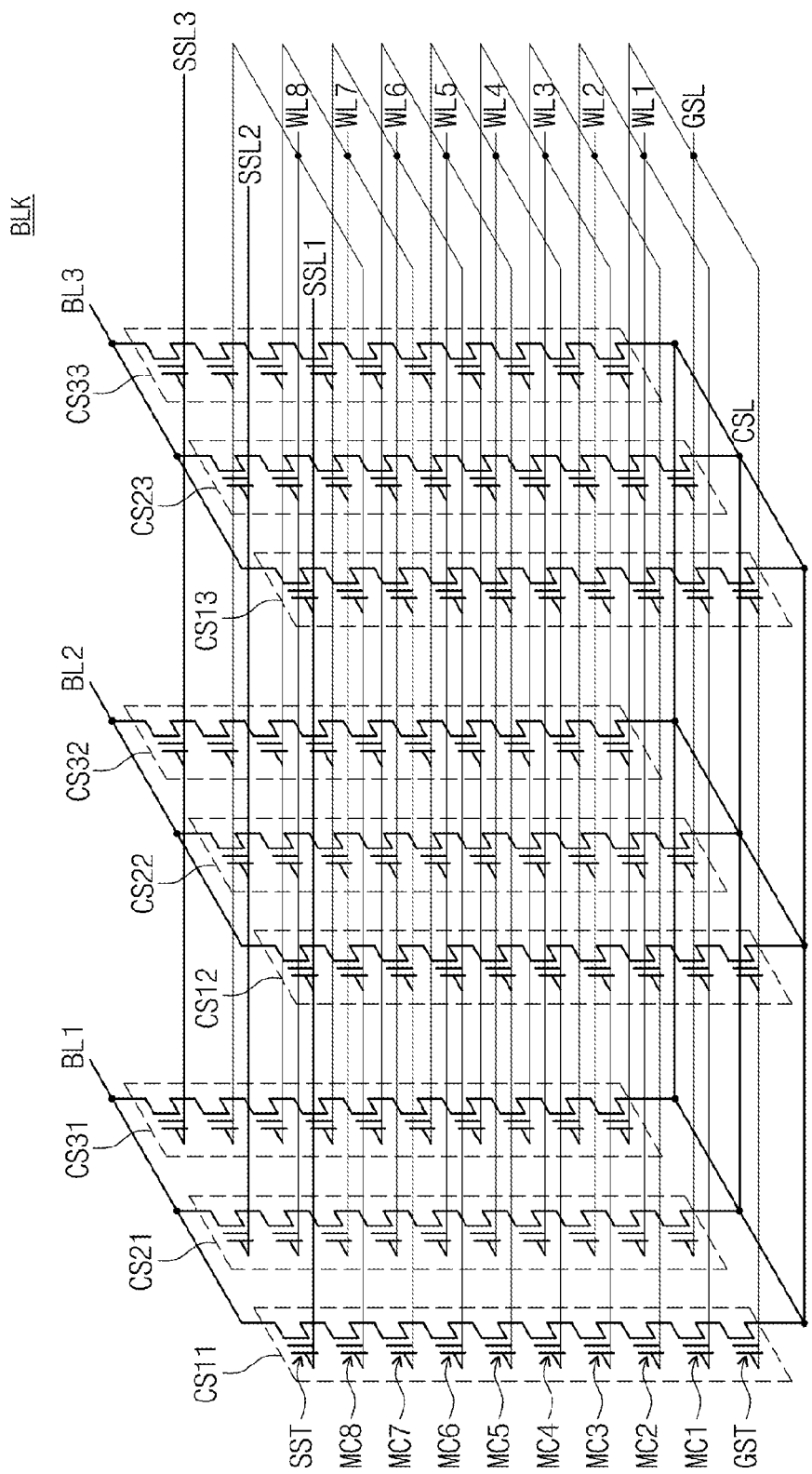
FIG. 6 is a drawing illustrating an equivalent circuit diagram of the memory block illustrated in FIG. 4.

FIG. 6 is a drawing illustrating an equivalent circuit diagram of the memory block illustrated in FIG. 4. Referring to FIG. 6, cell strings CS11~CS33 are connected between bit lines BL1~BL3 and a common source line CSL. Each cell string (for example, CS11) may include a ground select transistor GST, a plurality of memory cells MC1~MC8, and a string select transistor SST. For convenience of description, it is assumed that the number of memory cells included in a string is 8. However, the number of memory cells included in a string is not limited to 8.

The string select transistor SST is connected to a string select line SSL. The string select line SSL is divided into first through third string select lines SSL1~SSL3. In FIG. 6, three string select lines SSL1~SSL3 corresponding to one bit line are illustrated. However, the inventive concept is not limited to this example. The memory block BLK of the inventive concept may be constituted by at least 2 string select lines corresponding to one bit line.

The ground select transistor GST is connected to a ground select line GSL. Ground select lines GSL of the cell strings are connected to one another. The string select transistor SST is connected to a bit line BL and the ground select transistor GST is connected to a common source line CSL.

The memory cells MC1~MC8 may be connected to respective word lines WL1~WL8. A set of memory cells that are connected to one word line and programmed at the same time is called a page. The memory block BLK is constituted by a plurality of pages. A plurality of pages may be connected to one word line. Referring to FIG. 6, the word line (e.g., WL4) is connected to three pages in common.

Each memory cell can store one bit data or at least two bit data. A memory cell that can store one bit data in one memory cell is called a single level cell (SLC) or a single bit cell. A memory cell that can store at least two bit data in one memory cell is called a multi level cell (MLC) or a multi bit cell. In the case of a MCL of two bits, two page data is stored in one physical page. Thus, six page data can be stored in a memory cell connected to the fourth word line WL4.

The nonvolatile memory device 100 can be embodied by a charge trap flash (CTF). An initial verify shift (IVS) may occur that charges trapped in a programmed CTF are redistributed and carried away as time goes by. A reprogramming may be performed to overcome the distribution degradation phenomenon.

In the memory block BLK illustrated in FIG. 4, the ground select line GSL is shared. However, the inventive concept does not need to be limited thereto. The ground select line GSL of the inventive concept may be embodied by a separated structure like the string select line.

Figure 7:
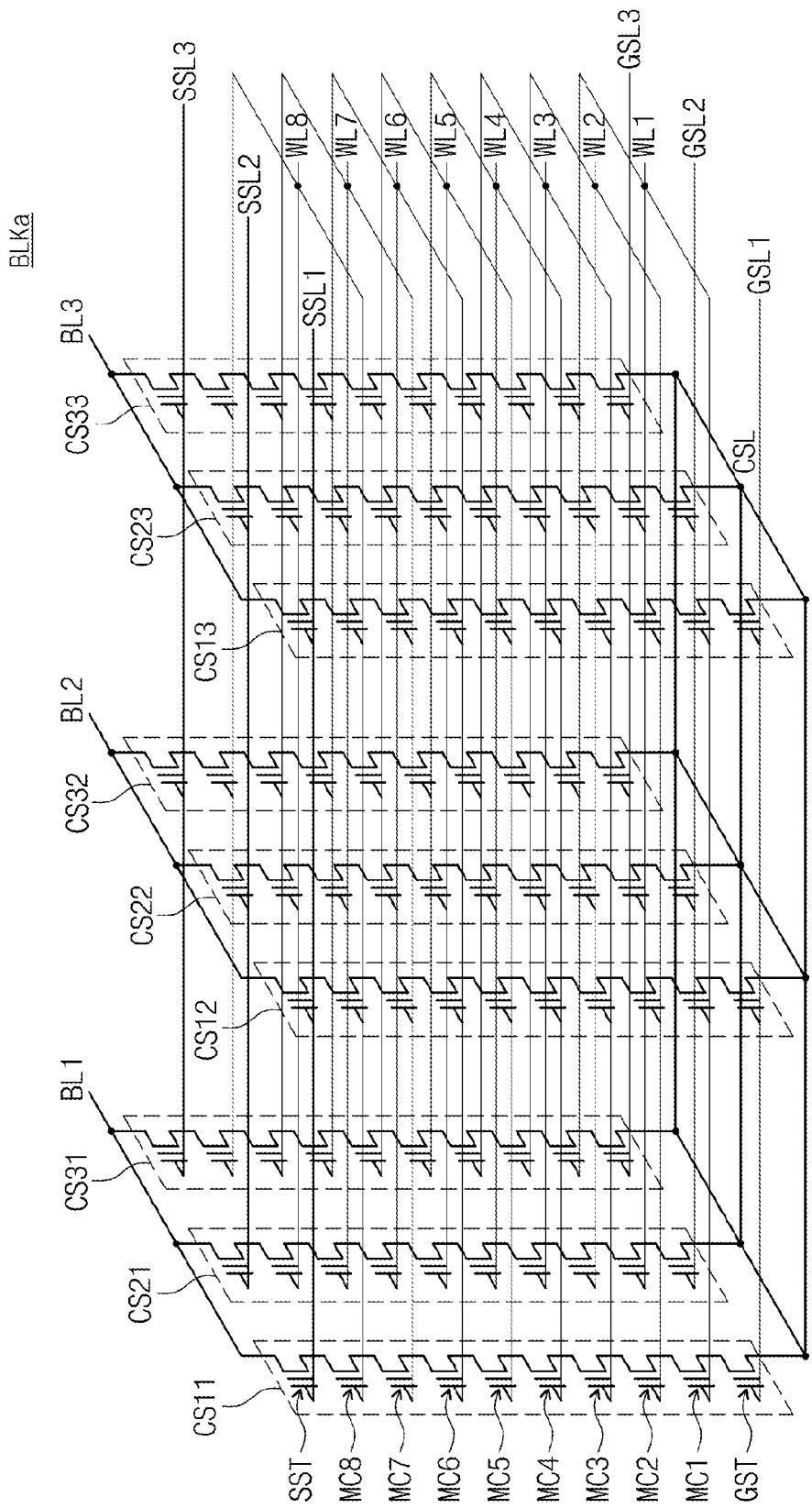
FIG. 7 is a drawing illustrating another equivalent circuit diagram of the memory block illustrated in FIG. 4.

FIG. 7 is a drawing illustrating another equivalent circuit diagram of the memory block illustrated in FIG. 4. Referring to FIG. 7, a memory block BLKa includes separated ground select lines GSL1, GSL2 and GSL3 compared with the memory block BLK illustrated in FIG. 6. The number of the separated ground select lines GSL1~GSL3 illustrated in FIG. 7 is three. However, the inventive concept is not limited to this example. The memory block BLKa may be constituted by at least two ground select lines.

In the memory block illustrated in FIGS. 4 through 7, the string is formed between the substrate 111 and the bit line. However, a structure of the inventive concept may not be limited to this example. The string of the inventive concept may be constituted by a first string formed between a substrate and a bit line and a second string formed between the substrate and a common source line.

Figure 8:
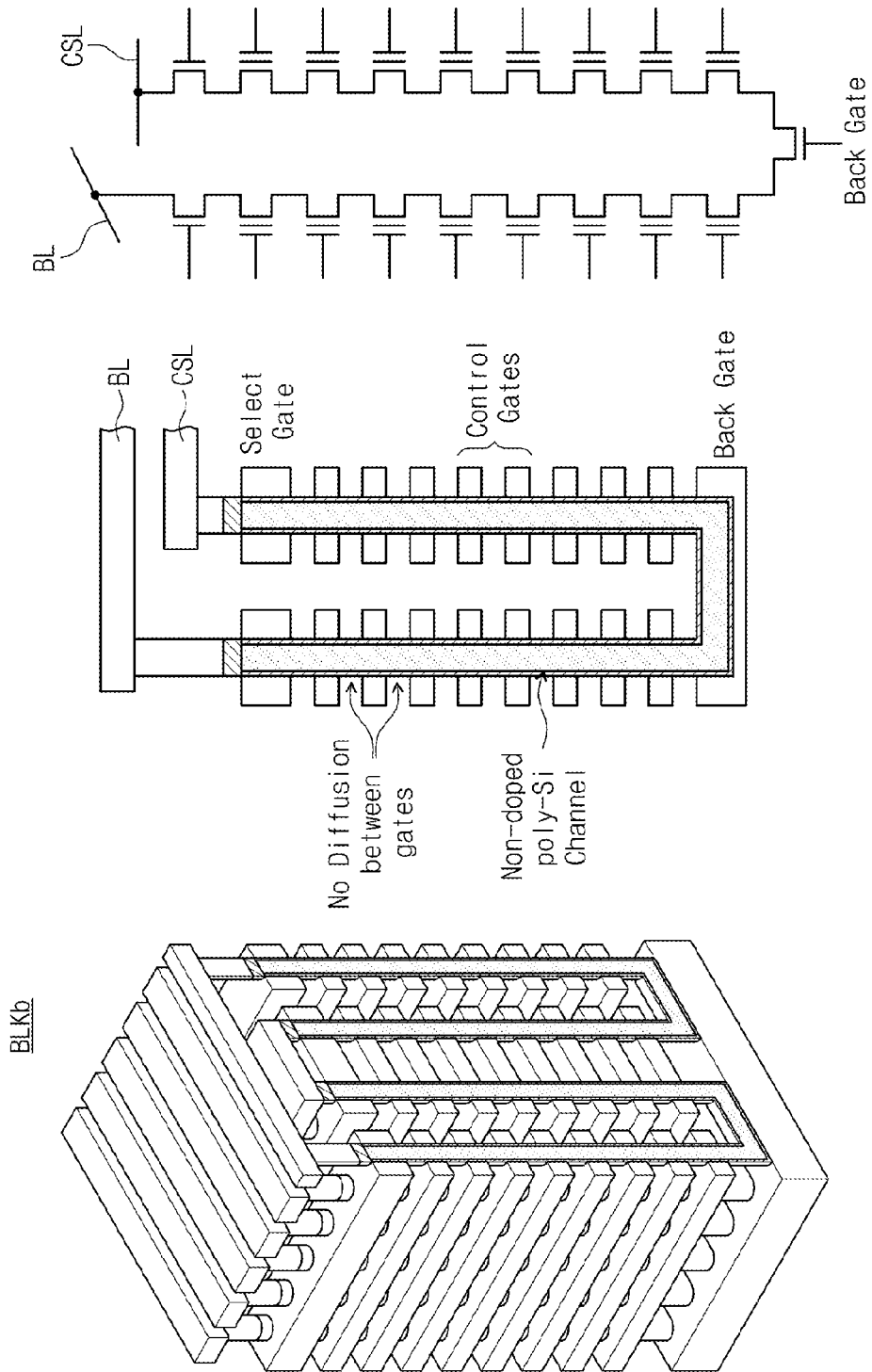
FIG. 8 is a drawing illustrating a memory block in accordance with another embodiment of the inventive concept.

FIG. 8 is a drawing illustrating a memory block in accordance with another embodiment of the inventive concept. Referring to FIG. 8, a string is formed between a bit line BL and a common source line CSL and may be constituted by first memory cells formed in a vertical direction between the bit line BL and a substrate and second memory cells formed in a vertical direction between the substrate and the common source line CSL.

A memory block BLKb may be embodied in a P-BiCS structure. Embodiments that a word line voltage Vw1 is applied to a word line are described below.

First, an offset pulse being applied to a selected word line in a read operation will be described.

Figure 9:
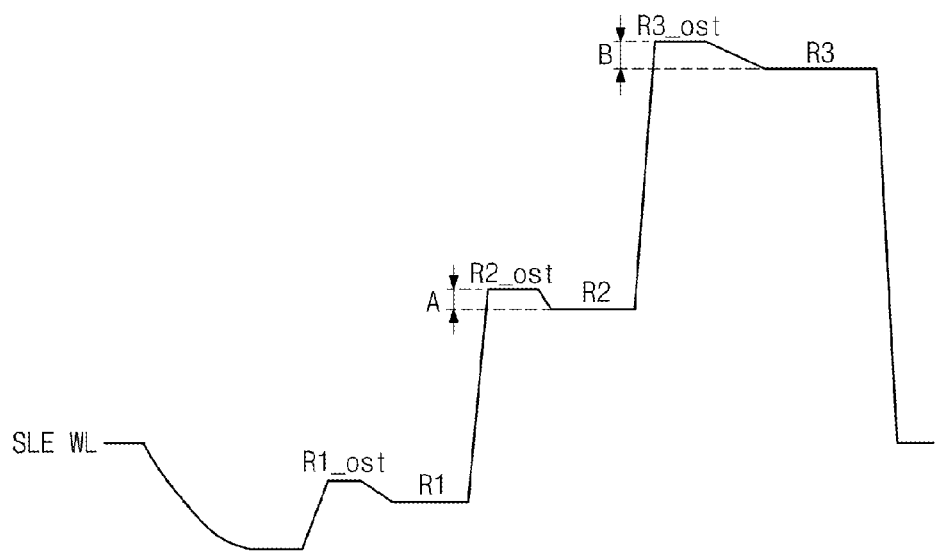
FIG. 9 is a drawing illustrating an embodiment of a waveform of a word line voltage being applied to a selected word line in a read operation of a nonvolatile memory device in accordance with an embodiment of the inventive concept.

FIG. 9 is a drawing illustrating an embodiment of a waveform of a word line voltage being applied to a selected word line in a read operation of a nonvolatile memory device in accordance with an embodiment of the inventive concept. Referring to FIG. 9, a first offset pulse R1_ost is applied to a selected word line SEL WL before a first read voltage R1 is applied, a second offset pulse R2_ost is applied to a selected word line SEL WL before a second read voltage R2 is applied, and a third offset pulse R3_ost is applied to a selected word line SEL WL before a third read voltage R3 is applied.

As described in FIG. 9, the first read voltage R1 is lower than the second read voltage R2 and the second read voltage R2 is lower than the third read voltage R3.

An offset A corresponding to the second offset pulse R2_ost may be greater than an offset B corresponding to the third offset pulse R3_ost. However, the inventive concept does not need to be limited to this example. The offset A may be equal to or smaller than the offset B.

The offset A or the offset B may be changed by at least one environmental information.

As illustrated in FIG. 9, a level of the first offset pulse R1_ost is higher than a target level of the first read voltage R1. However, the inventive concept does not need to be limited to this example. A level of the first offset pulse R1_ost may be lower than the target level of the first read voltage R1.

Figure 10:
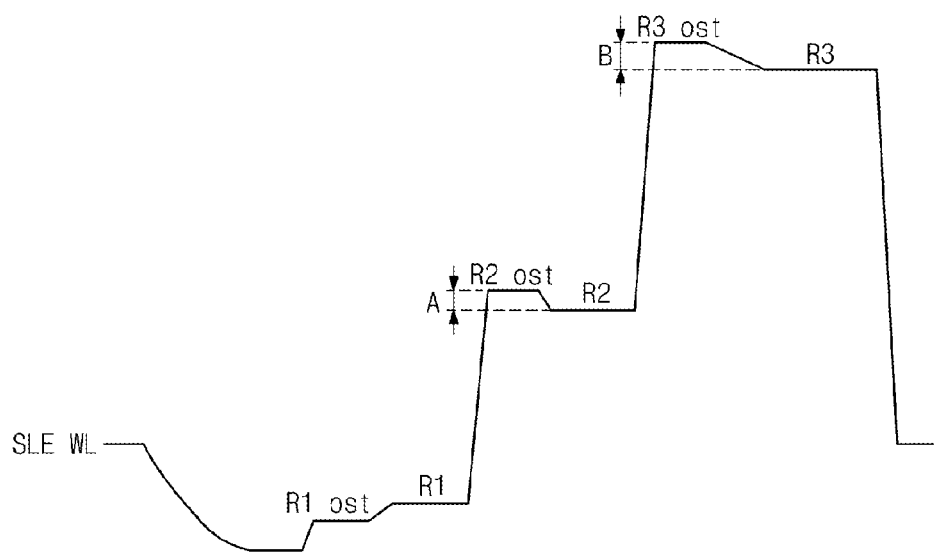
FIG. 10 is a drawing illustrating another embodiment of a waveform of a word line voltage being applied to a selected word line in a read operation of a nonvolatile memory device in accordance with an embodiment of the inventive concept.

FIG. 10 is a drawing illustrating another embodiment of a waveform of a word line voltage being applied to a selected word line in a read operation of a nonvolatile memory device in accordance with an embodiment of the inventive concept. Referring to FIG. 10, a level of the first offset pulse R1_ost is lower than a target level of the first read voltage R1 compared with that illustrated in FIG. 9.

In a read operation of the nonvolatile memory device 100, offset time that an offset pulse is applied may be changed.

Figure 11:
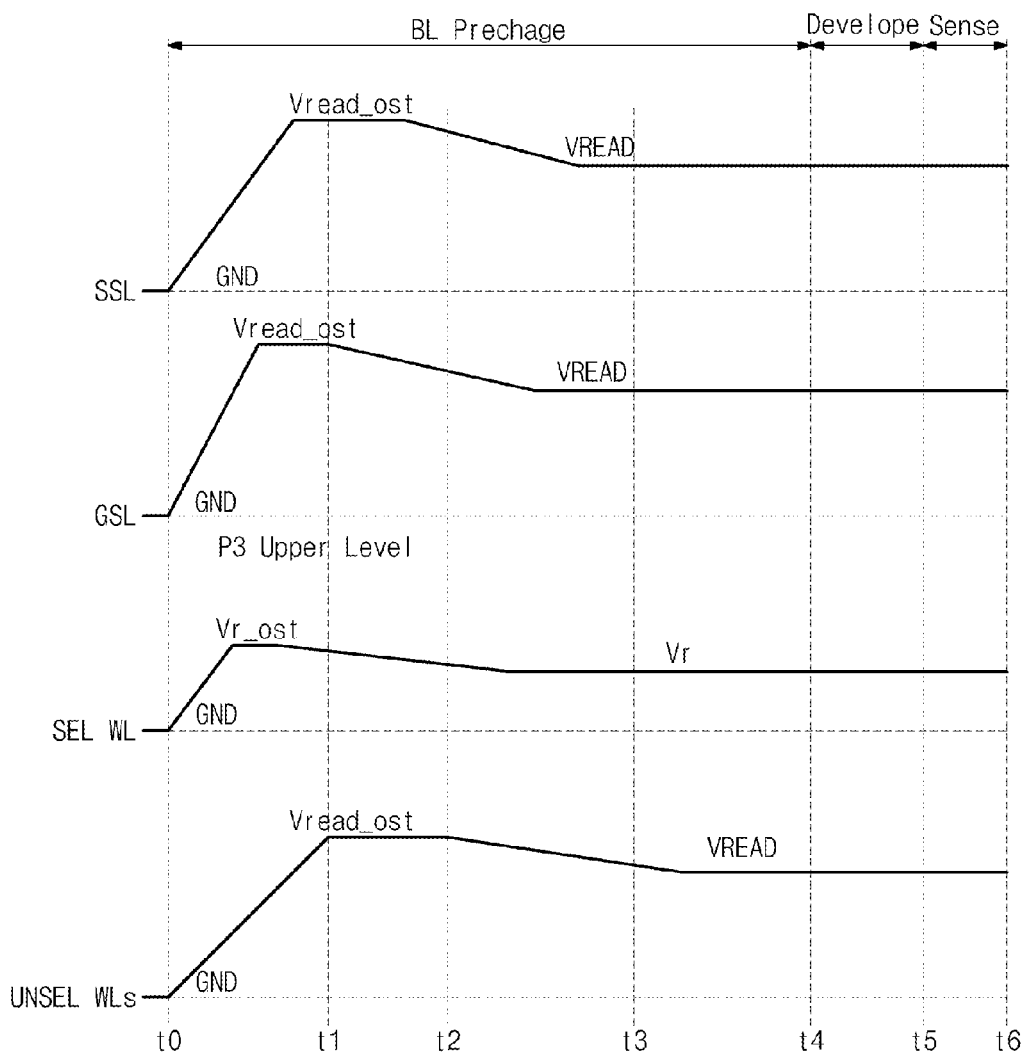
FIG. 11 is a drawing illustrating waveforms of lines to which a word line voltage is applied in a read operation of a nonvolatile memory device in accordance with an embodiment of the inventive concept.

FIG. 11 is a drawing illustrating waveforms of lines to which a word line voltage is applied in a read operation of a nonvolatile memory device in accordance with an embodiment of the inventive concept. Referring to FIG. 11, in a read operation, a first offset pulse Vread_ost and a read pass voltage Vread are sequentially applied to a string select line SSL, a ground select line GSL and unselect word lines UNSEL WLs and a second offset pulse Vr_ost and a read voltage Vr are sequentially applied to a selected word line SEL WL.

An offset time that the first offset pulse Vread_ost is applied is different by lines. As illustrated in FIG. 11, an offset time of the first offset pulse Vread_ost being applied to the string select line SSL may be longer than an offset time of the first offset pulse Vread_ost being applied to the ground select line GSL. An offset time of the first offset pulse Vread_ost being applied to the unselect word lines UNSEL WLs may be longer than an offset time of the first offset pulse Vread_ost being applied to the string select line SSL and the ground select line GSL.

As illustrated in FIG. 11, in a bit line precharge section, the offset pulses Vread_ost and Vr_ost are applied to the lines SSL, GSL, SEL WL and UNSEL WL and then the target pulses Vread and Vr are applied to the lines SSL, GSL, SEL WL and UNSEL WL. After that, a read operation is completed throughout a develop section and a sense section.

The nonvolatile memory device 100 can apply an offset pulse to a selected word line in a program operation.

Figure 12:
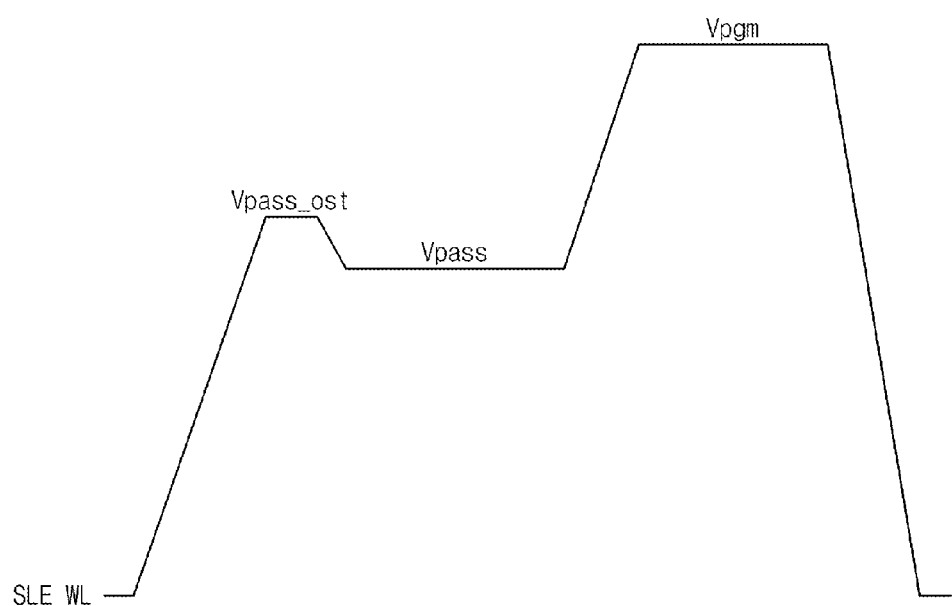
FIG. 12 is a drawing illustrating an embodiment of a waveform of a word line voltage being applied to a selected word line in a program operation of a nonvolatile memory device in accordance with an embodiment of the inventive concept.

FIG. 12 is a drawing illustrating an embodiment of a waveform of a word line voltage being applied to a selected word line in a program operation of a nonvolatile memory device in accordance with an embodiment of the inventive concept. Referring to FIG. 12, an offset pulse Vpass_ost, a pass voltage Vpass and a program voltage Vpgm are sequentially applied to a selected word line SEL WL.

The nonvolatile memory device 100 can apply an offset pulse to a selected word line in a program verification operation.

Figure 13:
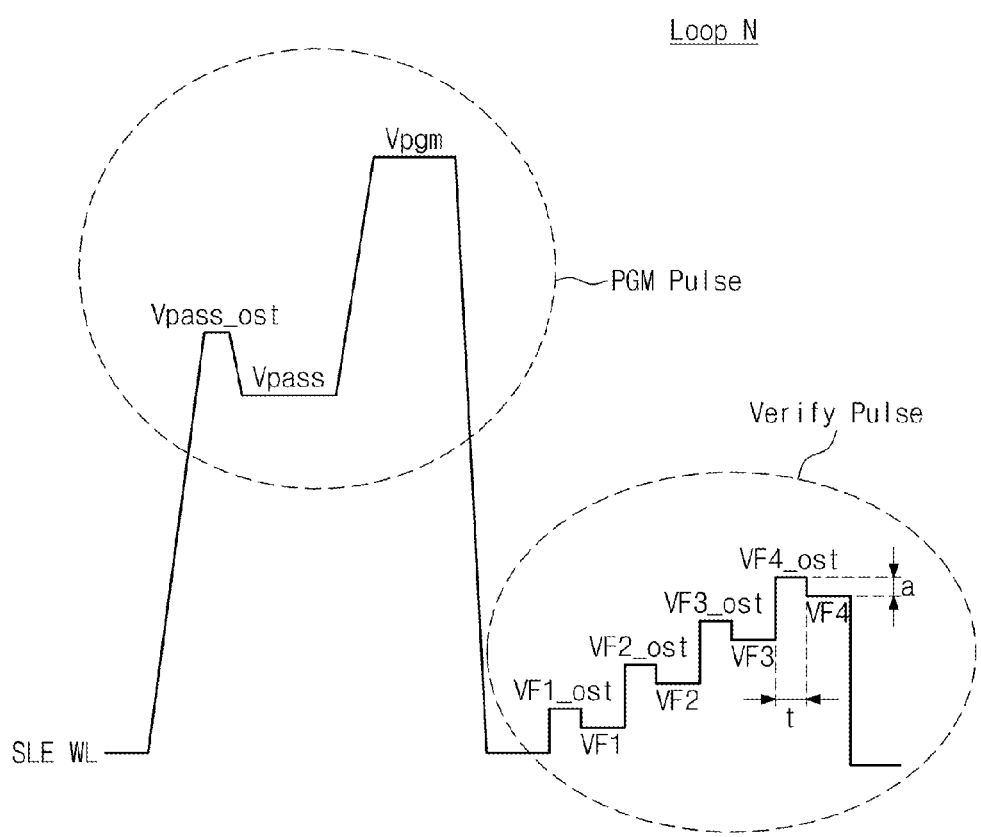
FIG. 13 is a drawing illustrating an embodiment of a waveform of a word line voltage being applied to a word line selected at the Nth program loop (loop N) in a program operation of a nonvolatile memory device in accordance with an embodiment of the inventive concept.

FIG. 13 is a drawing illustrating an embodiment of a waveform of a word line voltage being applied to a word line selected at the Nth program loop (Loop N) in a program operation of a nonvolatile memory device in accordance with an embodiment of the inventive concept. Referring to FIG. 13, a program loop (Loop N) is divided into a program pulse (PGM pulse) and a verify pulse. The program pulse is the same as that described in FIG. 11. For convenience of description, it is assumed that the verify pulse is constituted by first through fourth verify voltages VF1~VF4 for verifying four states. Offset pulses VF1_ost~VF4_ost are applied to the selected word line SEL WL before the verify voltages VF1~VF4 are applied.

An offset (a) corresponding to each of the offset pulses VF1_ost~VF4_ost may be the same. However, the inventive concept does not need to be limited to this example. At least one of offset times corresponding to the offset pulses VF1_ost~VF4_ost may be different.

In a program operation of the nonvolatile memory device 100, an offset or an offset time may be changed on the basis of pass/fail information in accordance with a progress of a program loop.

Figure 14:
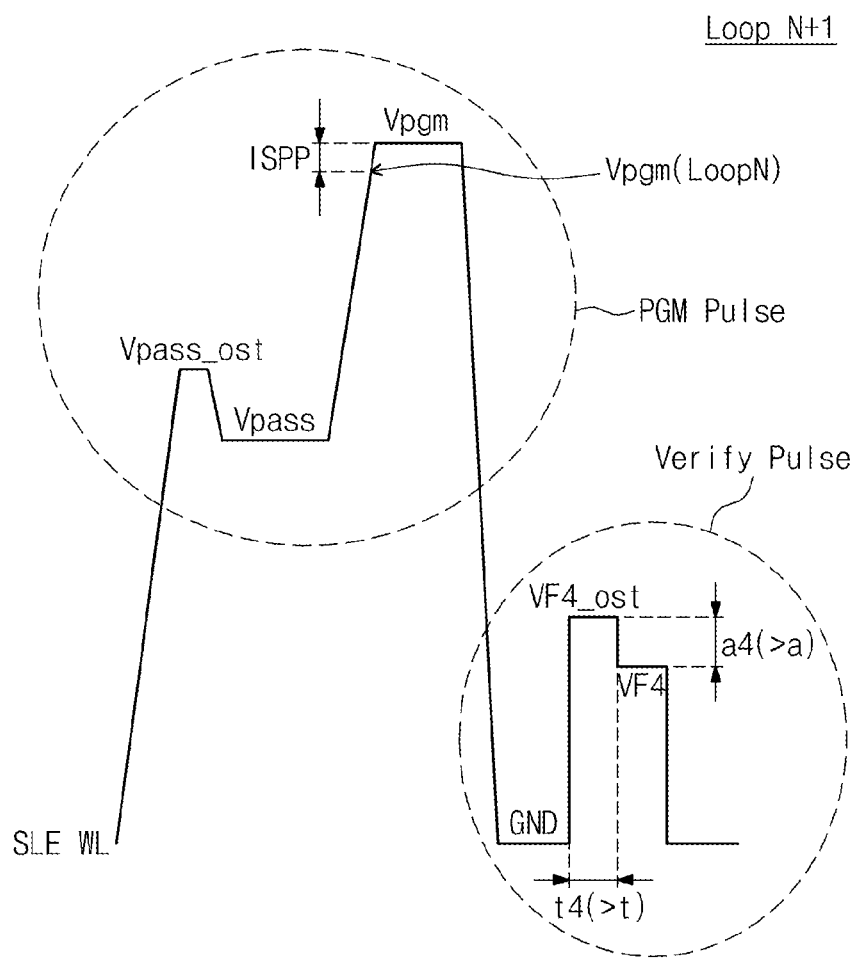
FIG. 14 is a drawing illustrating an embodiment of a waveform of a word line voltage being applied to a word line selected at the N+1th program loop (loop N+1) in a program operation of a nonvolatile memory device in accordance with an embodiment of the inventive concept.

FIG. 14 is a drawing illustrating an embodiment of a waveform of a word line voltage being applied to a word line selected at the N+1th program loop (loop N+1) in a program operation of a nonvolatile memory device in accordance with an embodiment of the inventive concept. Referring to FIG. 14, it is assumed that an N+1th program loop (Loop N+1) is performed after the Nth program loop (Loop N) illustrated in FIG. 13. For convenience of description, it is assumed that a program operation with respect to first through third states is completed in the Nth program operation (Loop N). Thus, in the N+1th program loop (Loop N+1), there are a program pulse (PGM Pulse) applying a program voltage Vpgm increased by a predetermined value ISSP and a verify pulse applying a verify voltage VF4 with respect to a fourth state.

An offset (a4) corresponding to an offset pulse VF4_ost with respect to the fourth state may be different from the offset (a) illustrated in FIG. 13. The offset (a4) may be greater than the offset (a).

An offset time (t4) that the offset pulse VF4_ost with respect to the fourth state is applied may be different from the offset time (t) illustrated in FIG. 13. The offset time (t4) may be longer than the offset time (t).

An offset or an offset time of the inventive concept may be changed by a voltage difference between a level (e.g., GND) of a select word line SEL WL of a previous operation and a target level (e.g., VF4) of a current operation.

Figure 15:
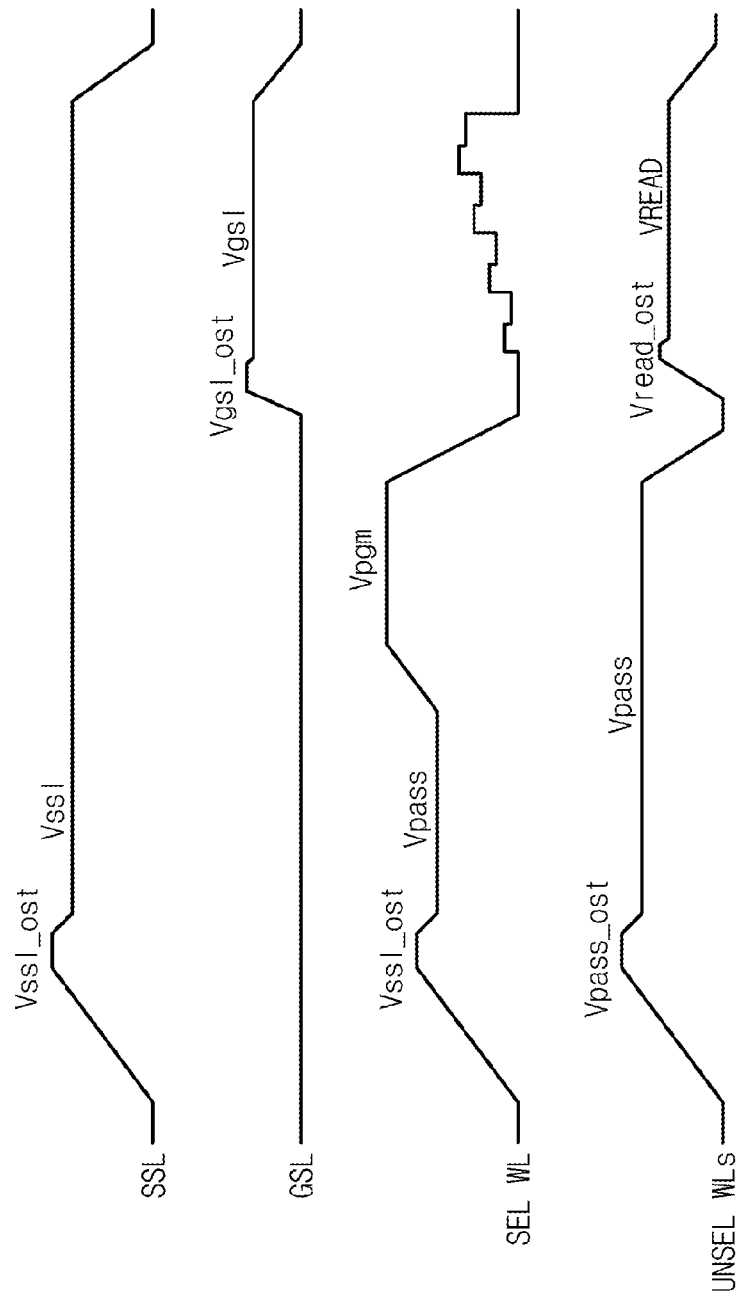
FIG. 15 is a drawing illustrating waveforms of lines to which a word line voltage is applied in a program operation of a nonvolatile memory device in accordance with an embodiment of the inventive concept.

FIG. 15 is a drawing illustrating waveforms of lines to which a word line voltage is applied in a program operation of a nonvolatile memory device in accordance with an embodiment of the inventive concept. Referring to FIG. 15, an offset pulse Vss1_ost is applied to a string select line SSL before a string select line voltage Vss1 is applied, an offset pulse Vgs1_ost is applied to a ground select line GSL before a ground select line voltage Vgs1 is applied, in a program operation, an offset pulse Vpass_ost is applied to an unselect word lines UNSEL WLs before a pass voltage Vpass is applied and in a verify operation, an offset pulse Vread_ost is applied to an unselect word lines UNSEL WLs before the read pass voltage Vread is applied. A voltage applying with respect to a selected word line SEL WL is the same as that described in FIGS. 12 through 14.

Figure 16:
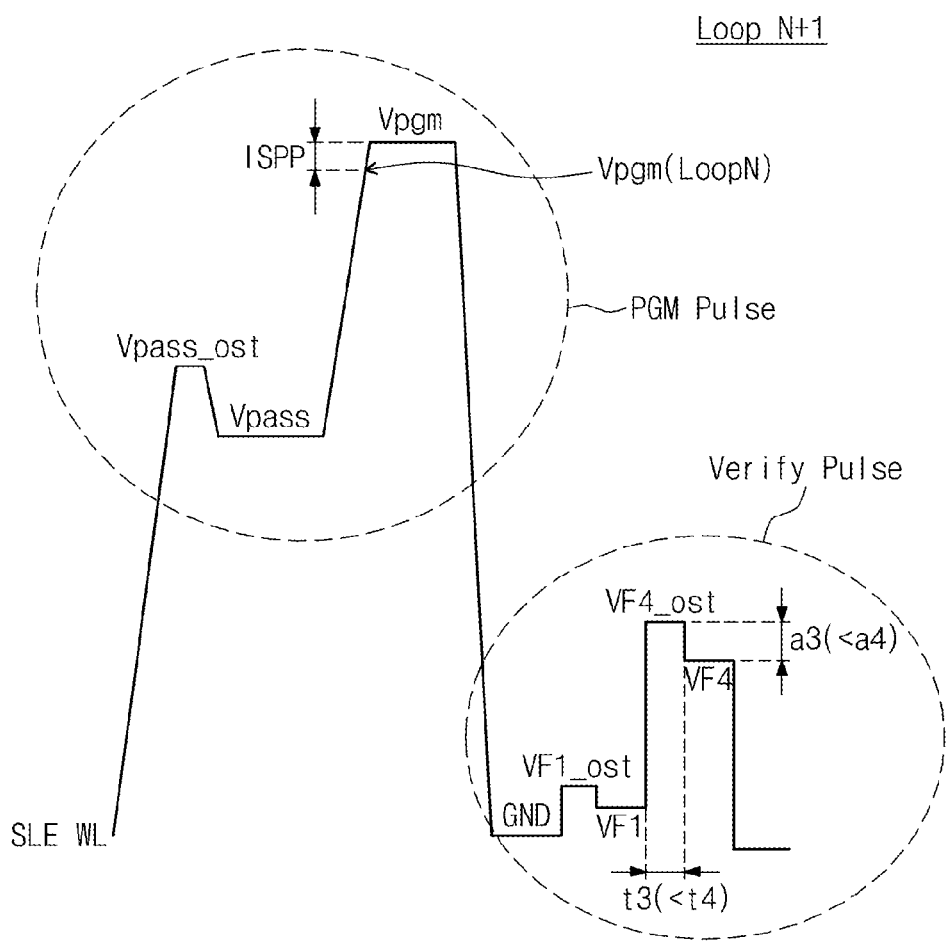
FIG. 16 is a drawing illustrating another embodiment of a waveform of a word line voltage being applied to a word line selected at the N+1th program loop (loop N+1) in a program operation of a nonvolatile memory device in accordance with an embodiment of the inventive concept.

FIG. 16 is a drawing illustrating another embodiment of a waveform of a word line voltage being applied to a word line selected at the N+1th program loop (loop N+1) in a program operation of a nonvolatile memory device in accordance with an embodiment of the inventive concept. Referring to FIG. 16, it is assumed that an N+1th program loop (Loop N+1) is performed after the Nth program loop (Loop N) illustrated in FIG. 13. For convenience of description, it is assumed that a program operation with respect to second and third states is completed in the Nth program operation (Loop N). Thus, in the N+1th program loop (Loop N+1), there are a program pulse (PGM Pulse) applying a program voltage Vpgm increased by a predetermined value ISSP and a verify pulse applying verify voltages VF1 and VF4 with respect to a first state and a fourth state.

An offset (a3) corresponding to the offset pulse VF4_ost with respect to the fourth state may be different from the offset (a4) illustrated in FIG. 14. The offset (a3) may be smaller than the offset (a4). This is because in FIG. 14, the offset (a4) of the fourth verify voltage VF4 corresponds to a voltage difference VF4 and in FIG. 15, the offset (a3) of the fourth verify voltage VF4 corresponds to a voltage difference VF4-VF1.

An offset time t3 that the offset pulse VF4_ost with respect to the fourth state is applied may be different from the offset time (t4) illustrated in FIG. 14. The offset time (t3) may be shorter than the offset time (t4).

In the verify pulse of the nonvolatile memory device 100, at least one of verify voltages may be embodied by a negative voltage.

Figure 17:
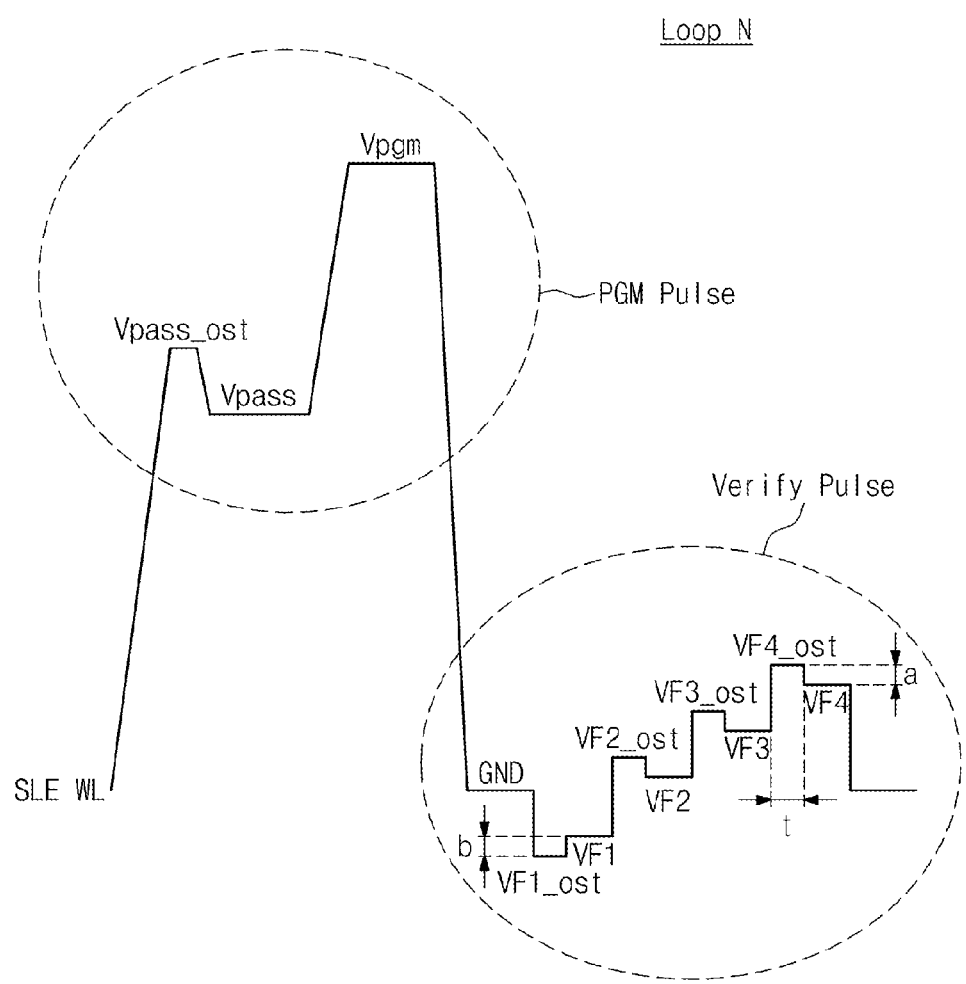
FIG. 17 is a drawing illustrating another embodiment of a waveform of a word line voltage being applied to a word line selected at the Nth program loop (loop N) in a program operation of a nonvolatile memory device in accordance with an embodiment of the inventive concept.

FIG. 17 is a drawing illustrating another embodiment of a waveform of a word line voltage being applied to a word line selected at the Nth program loop (Loop N) in a program operation of a nonvolatile memory device in accordance with an embodiment of the inventive concept. Referring to FIG. 17, except that the first verify voltage VF1 is a negative voltage and the first offset pulse VF1_ost corresponding to the first verify voltage VF1 is lower than the first verify voltage VF1, the program loop (Loop N) is the same as that illustrated in FIG. 13.

An offset (b) corresponding to the first offset pulse VF1_ost may be same as or different from the offset (a) of each of the second through fourth offset pulses VF2_ost~VF4_ost. An offset time that the first offset pulse VF1_ost is applied may be the same as or different from the offset time (t) of each of the second through fourth offset pulses VF2_ost~VF4_ost.

In FIGS. 12 through 17, an offset pulse is not applied before a program voltage Vpgm is applied. However, the inventive concept does not need to be limited thereto. In the nonvolatile memory device 100, an offset pulse may be applied before a program voltage Vpgm is applied.

Figure 18:
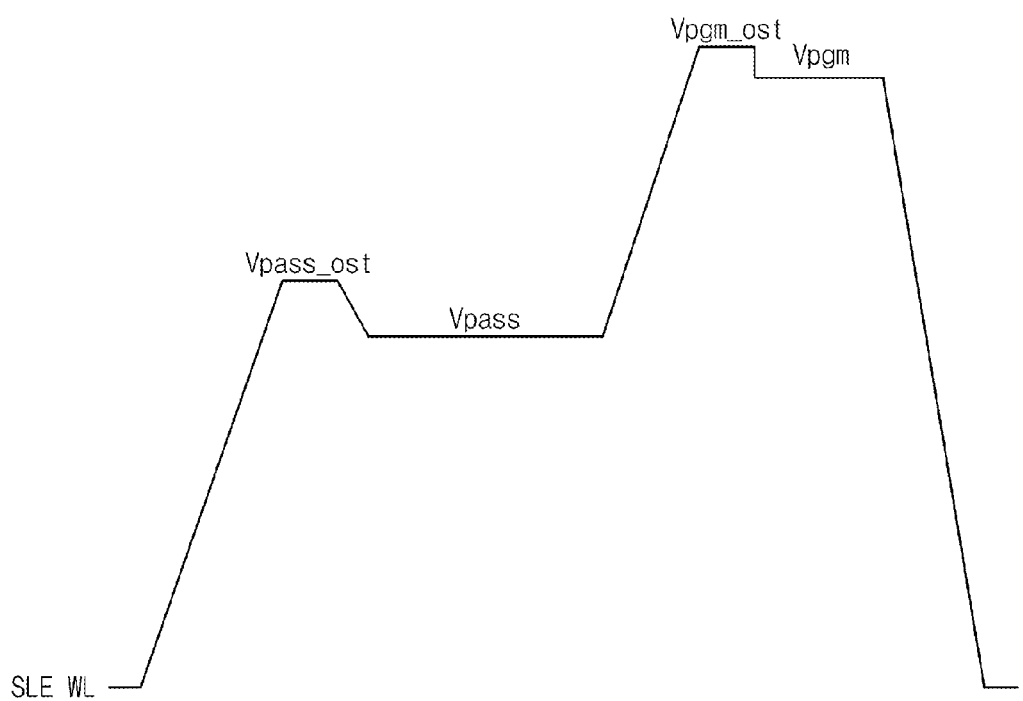
FIG. 18 is a drawing illustrating another embodiment of a waveform of a word line voltage being applied to a selected word line in a program operation of a nonvolatile memory device in accordance with an embodiment of the inventive concept.

FIG. 18 is a drawing illustrating another embodiment of a waveform of a word line voltage being applied to a selected word line in a program operation of a nonvolatile memory device in accordance with an embodiment of the inventive concept. Referring to FIG. 18, a first offset pulse Vpass_ost is applied before a pass voltage Vpass is applied to a selected word line SEL WL and a second offset pulse Vpgm_ost is applied before a program voltage Vpgm is applied to a selected word line SEL WL.

Figure 19:
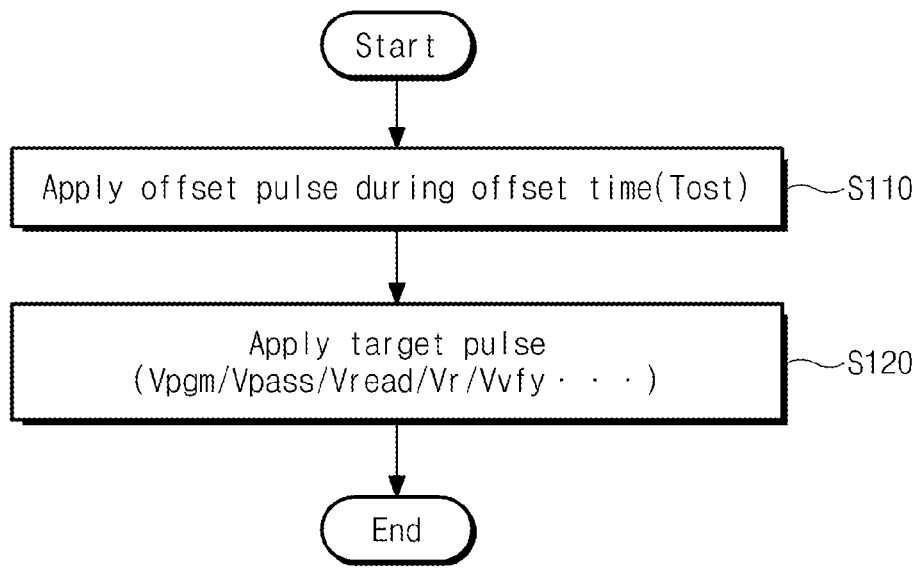
FIG. 19 is a flow chart illustrating a first embodiment of a word line driving method of a nonvolatile memory device in accordance with an embodiment of the inventive concept.

FIG. 19 is a flow chart illustrating a first embodiment of a word line driving method of a nonvolatile memory device in accordance with an embodiment of the inventive concept. Referring to FIGS. 1 through 19, a word line driving method of a nonvolatile memory device is as follows. An offset pulse is applied during an offset time Tost (S110). After that, a target pulse needed to drive a word line is applied (S120). The target pulse may be one of a pass voltage Vpass, a read pass voltage Vread, a read voltage Vr and a verify voltage VF.

In the word line driving method in accordance with some embodiments of the inventive concept, a target pulse is applied after an offset pulse is applied.

The word line driving method of the inventive concept may add a step of setting a level and/or time of an offset pulse.

Figure 20:
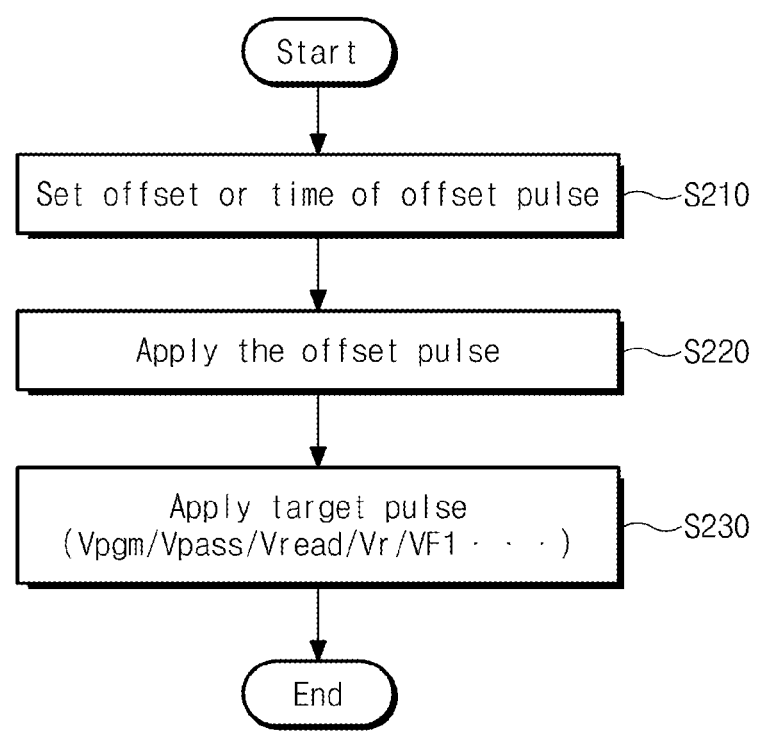
FIG. 20 is a flow chart illustrating a second embodiment of a word line driving method of a nonvolatile memory device in accordance with an embodiment of the inventive concept.

FIG. 20 is a flow chart illustrating a second embodiment of a word line driving method of a nonvolatile memory device in accordance with an embodiment of the inventive concept. Referring to FIG. 20, a word line driving method adds a step S210 compared with that illustrated in FIG. 19. In the step S210, an offset or time of an offset pulse is set. The offset or time of an offset pulse can be set on the basis of at least one environmental information such as the number of program loops, an operation mode, pass/fail information of a specific program state, state information, temperature information, a program/erase cycle, information about degree of the number of operations, information about a physical structure of a word line, location information, address information, selection/non-selection information, time information, etc.

The word line driving method of the inventive concept can selectively perform whether or not to apply an offset pulse.

Figure 21:
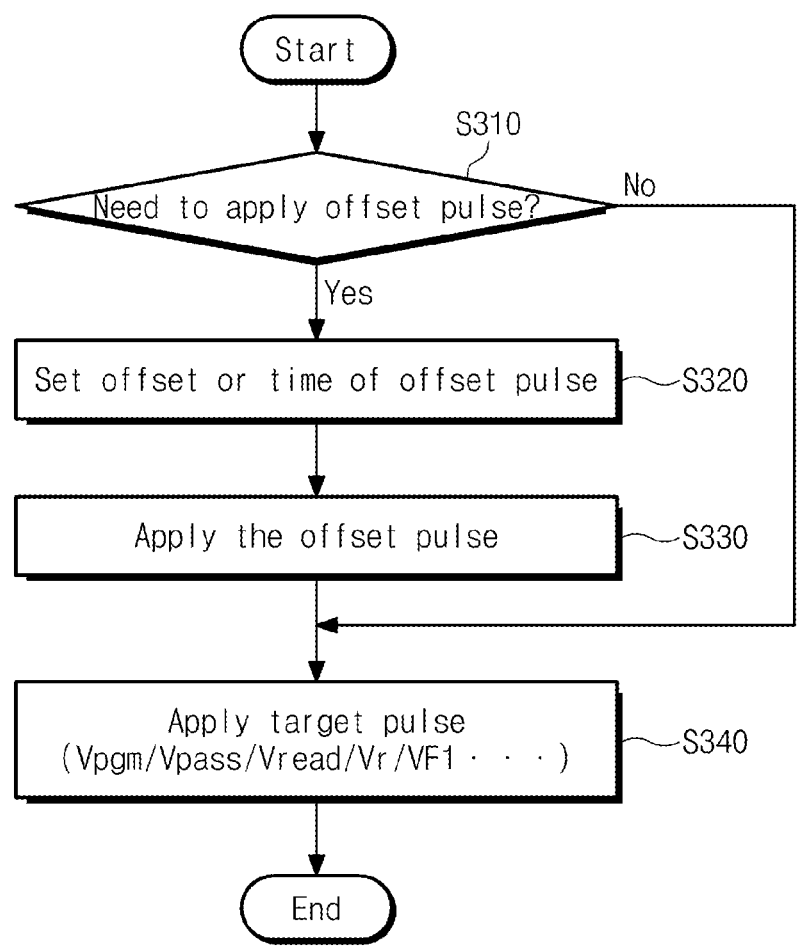
FIG. 21 is a flow chart illustrating a third embodiment of a word line driving method of a nonvolatile memory device in accordance with an embodiment of the inventive concept.

FIG. 21 is a flow chart illustrating a third embodiment of a word line driving method of a nonvolatile memory device in accordance with an embodiment of the inventive concept. Referring to FIG. 21, the word line driving method adds a step S310 compared with that illustrated in FIG. 20. In the step S310, it may be determined whether or not to apply an offset pulse. Whether or not to apply an offset pulse may be determined on the basis of at least one environmental information such as the number of program loops, an operation mode, pass/fail information of a specific program state, state information, temperature information, a program/erase cycle, information about degree of the number of operations, information about a physical structure of a word line, location information, address information, selection/non-selection information, time information, etc. For example, an offset pulse may be applied to improve a program speed. An offset pulse may not be applied to reduce power consumption.

Figure 22:
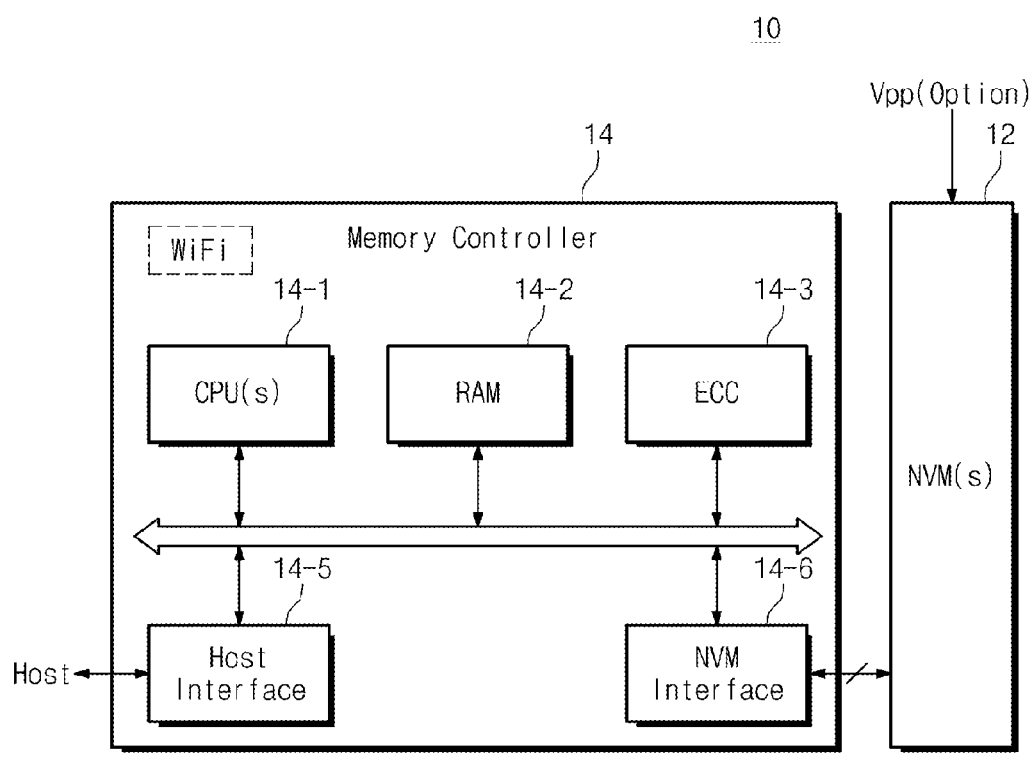
FIG. 22 is a block diagram illustrating a storage device in accordance with an embodiment of the inventive concept.

FIG. 22 is a block diagram illustrating a storage device 10 in accordance with an embodiment of the inventive concept. Referring to FIG. 22, the storage device 10 includes at least one nonvolatile memory device 12 and a memory controller 14 controlling the nonvolatile memory device 12. The storage device 10 may be storage medium such as a memory card (CF, SD, microSD, etc.), a USB storage device, etc.

The nonvolatile memory device 12 may be embodied by the nonvolatile memory device 100 and the word line apply method of the nonvolatile memory device 100 described in FIGS. 1 through 21. The nonvolatile memory device 12 may be embodied to set an offset and time of an offset pulse on the basis of environmental information.

The memory controller 14 can generate offset pulse setting information corresponding to at least one environmental information such as the number of program loops, an operation mode, pass/fail information of a specific program state, state information, temperature information, a program/erase cycle, information about degree of the number of operations, information about a physical structure of a word line, location information, address information, selection/non-selection information, time information, etc. and can provide the offset pulse setting information to the nonvolatile memory device 12 to set an offset and time of an offset pulse.

Values corresponding to an offset and time corresponding to environmental information may be stored in a table form.

The memory controller 14 controls read, write and erase operations with respect to the nonvolatile memory device 12 in response to a request of a host. The memory controller 14 includes at least one central process unit 14-1, a buffer memory (RAM) 14-2, an error correction code (ECC) circuit 14-3, a host interface 14-5 and a NVM interface 14-6.

The central processing unit 14-1 can control an overall operation (for example, a read operation, a write operation, a file system management, a bad page management, etc.) with respect to the nonvolatile memory device 12. The RAM 14-2 operates under the control of the central processing unit 14-1 and may be used as a work memory, a buffer memory, a cache memory, etc. In the case that the RAM 14-2 is used as a work memory, data being processed by the central processing unit 14-1 is temporarily stored. In the case that the RAM 14-2 is used as a buffer memory, it is used to buffer data to be transmitted from the host to the nonvolatile memory device 12 or from the nonvolatile memory device 12 to the host. In the case that the RAM 14-2 is used as a cache memory, the low speed nonvolatile memory device 12 operates at high speed.

The ECC circuit 14-3 generates an error correction code (ECC) for correcting a fail bit or an error bit of data received from the nonvolatile memory device 12. The ECC circuit 14-3 performs an error correction coding of data being provided to the nonvolatile memory device 12 to form data to which a parity bit is added. The parity bit may be stored in the nonvolatile memory device 12. The ECC circuit 14-3 can perform an error correction decoding on data output from the nonvolatile memory device 12. The ECC circuit 14-3 can correct an error using parity. The ECC circuit 14-3 can correct an error using a coded modulation such as a LDPC (low density parity check), a BCH code, a turbo code, a Reed-Solomon code, a convolution code, a RSC (recursive systematic code), a TCM (trellis-coded modulation), a BCM (block coded modulation), etc.

The memory controller 14 exchanges data with the host through the host interface 14-5 and exchanges data with the nonvolatile memory device 12 through the NVM interface 14-6. The host interface 14-5 can be connected to the host through a PATA (parallel at attachment) bus, a SATA (serial at attachment) bus, a SCSI, a USB, a PCIe, a NAND interface, etc.

The memory controller 14 can be loaded with a wireless communication function (e.g., WiFi).

Since in a general VNAND structure, a WL loading becomes relatively great compared with a planar NAND flash memory and a loading is different according to WLs, a WL setup time may become an important factor of performance in a read/verify operation. In the VNAND of the inventive concept, when a read/verify operation is performed, a difference of setup time between Near/Far of a word line can be reduced by setting a voltage to a target level again after applying the voltage higher or lower than the target level of a word line for a specific time. By reducing a difference of a setting time, total word line setting time can be reduced. This is called a word line offset applying technology. In the VNAND of the inventive concept, the word line offset applying technology can be selectively applied.

In the VNAND of the inventive concept, by equalizing a setup time between Near/Far of a word line using an overshooting, the total word line setting time can be reduced. The VNAND of the inventive concept can selectively subdivide the overshooting according to a cell state to apply it. For example, in a plurality of read operations, various cases may exist according to a target voltage of each read operation. An undershooting may be used without using an overshooting. A case may be exist which does not apply an overshooting/undershooting according to a state when necessary.

When applying an overshooting/undershooting for a specific time, to obtain an optimum effect, a difference of voltages being applied and an applying time may be differently set according to a state. The amount of change of a WL voltage between states is different at every state. Even though the same voltage difference exists, a difference of voltages being applied and an applying time may be differently set depending on starting from which level. For example, when a voltage transits from −1V to 2V and from 2V to 5V, the voltage equally moves by 3V but a transition speed may be different by a difference of an internal circuit such as a voltage generator, a pump, etc. Thus, a size of an overshooting offset and an applying time may be differently controlled according to a state by a difference between a starting voltage and a target voltage.

A 2 step WL setting of overshooting/undershooting can be applied to a verify operation immediately after a program operation is performed. An offset voltage difference of overshooting/undershooting and an applying time may be set through pass/fail information of a verify operation with respect to a specific program state.

In a verify operation, a level of a word line sequentially increases according to a verify level at first. However, in the case that a level of high rank word line comes immediately after a verify operation of a front state is passed after a specific loop, a WL setting time may be longer compared with that of a previous loop. A word line setting time for a verify operation of a high rank state may be insufficient because a fail bit occurs in a specific low rank state. At this time, a proper voltage offset value and applying time can be set with reference to a lookup table previously defined inside the VNAND in response to an increased voltage difference. An offset value may be different depending on whether a voltage level of the first state is located at a positive region or whether a voltage level of the first state is located at a negative region. As described above, through the WL 2 step setting method using pass/fail information, a distribution improvement deterioration can be improved that may be caused by the insufficient WL setting time from after the specific loop.

In a read/verify operation, the nonvolatile memory device in accordance with some embodiments of the inventive concept can maintain a voltage having a level higher or lower than a target voltage for a specific time in a consecutive cell state operation and then change the voltage to the target voltage after the specific time. In a read/verify operation, the nonvolatile memory device can selectively perform maintaining a voltage having a level higher or lower than a target voltage in a specific program state sensing operation. The nonvolatile memory device can differently set an offset and applying time according to a voltage difference between cell states and a voltage value at which a transition begins. In a verify operation, the nonvolatile memory device can selectively perform maintaining a voltage having a level higher or lower than a target voltage according to pass/fail information in a consecutive cell state verify operation. In a verify operation, the nonvolatile memory device can differently set an offset of a voltage value and applying time corresponding to a target level on the basis of the pass/fail information in a consecutive cell state verify operation. The nonvolatile memory device can set so that an offset and applying time is changed on the basis of a location of a word line.

Figure 23:
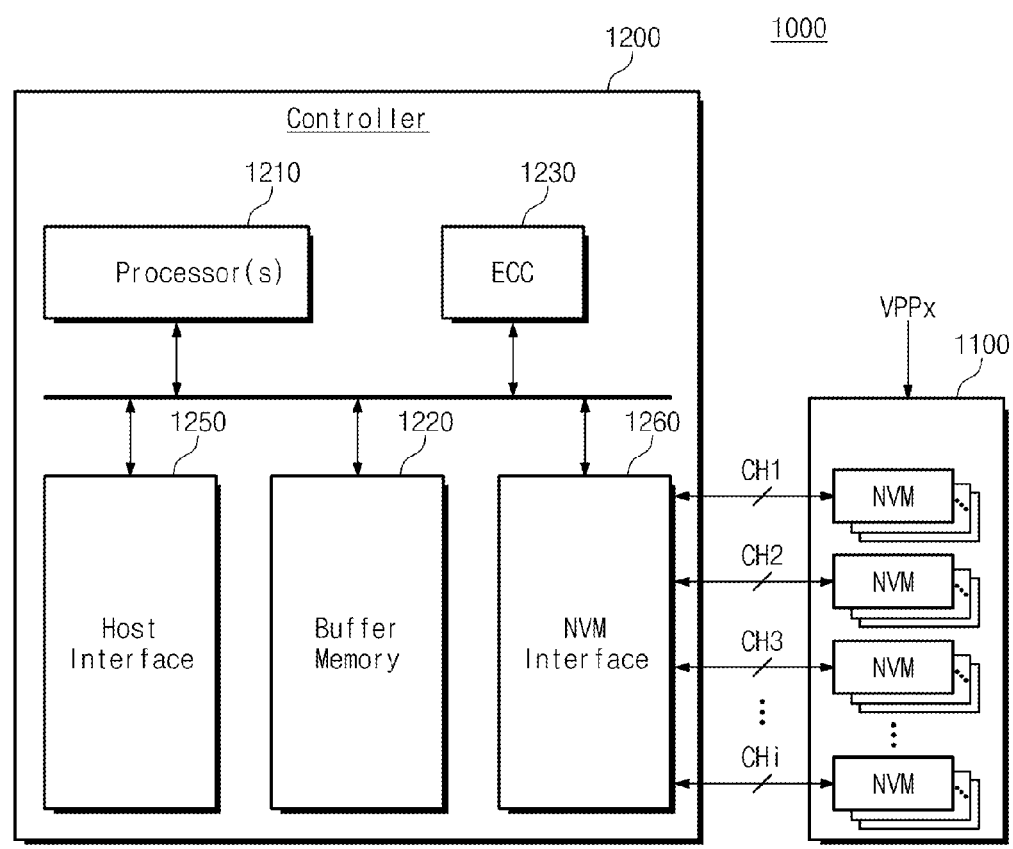
FIGS. 23, 24, 25 and 26 are drawings illustrating respective application examples of the inventive concept.

The inventive concept can be applied to a solid state drive (SSD). FIG. 23 is a block diagram illustrating a SSD in accordance with an embodiment of the inventive concept. Referring to FIG. 23, a SSD 1000 includes a plurality of nonvolatile memory devices 1100 and a SSD controller 1200.

The nonvolatile memory devices 1100 can be embodied to optionally receive an external high voltage Vpp. Each nonvolatile memory device 1100 can be embodied to generate a word line voltage Vw1 having a variable offset pulse as described in FIGS. 1 through 21. The SSD controller 1200 is connected to the nonvolatile memory devices 1100 through a plurality of channels CH1~CHi (i is an integer of two or more). The SSD controller 1200 includes at least one processor 1210, a buffer memory 1220, an error correction code circuit 1230, a host interface 1250 and a nonvolatile memory interface 1260.

The buffer memory 1220 temporarily stores data needed to drive the memory controller 1200. The buffer memory 1220 may include a plurality of memory lines storing data or command. The memory lines can be mapped to cache lines by various methods. The error correction code circuit 1230 can calculate an error correction code value of data to be programmed, correct an error of data read in a read operation on the basis of the error correction code value and correct an error of data restored from the nonvolatile memory device 1100 in a data restoration operation. Although not illustrated in the drawing, a code memory storing code data needed to drive the memory controller 1200 may be further included. The code memory can be embodied by a nonvolatile memory device.

The host interface 1250 can provide an interface function with an external device. The host interface 1250 may be a NAND flash interface. The host interface 1250 can be embodied by various interfaces and a plurality of interfaces. The nonvolatile memory interface 1260 can provide an interface function with the nonvolatile memory device 1100.

The SSD 1000 can expect an improvement of a program speed by applying a word line voltage Vw1 having an offset pulse to a word line in a program operation.

Figure 24:
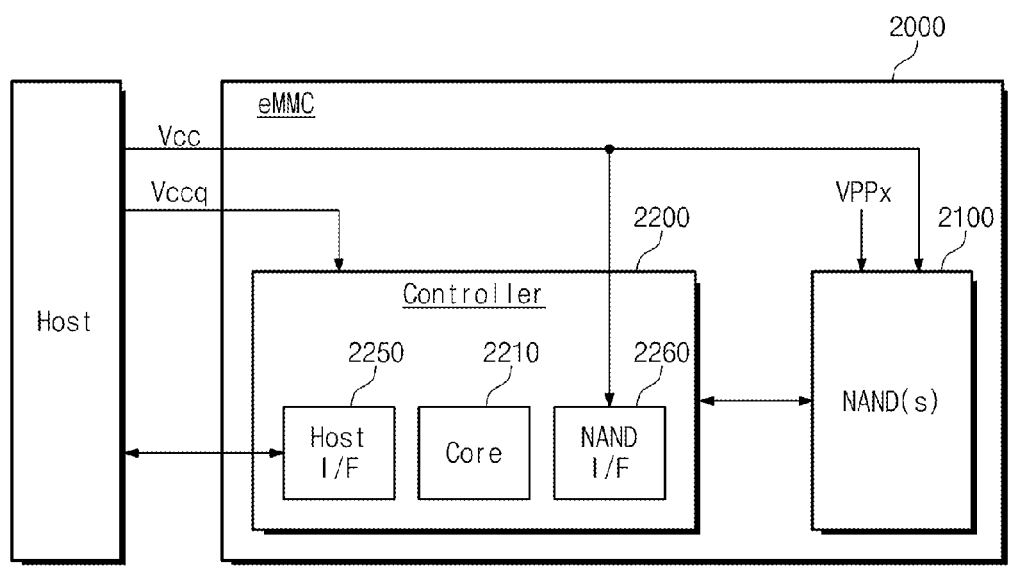

The inventive concept can be applied to an embedded multi media card (eMMC). FIG. 24 is a block diagram illustrating an eMMC in accordance with an embodiment of the inventive concept. Referring to FIG. 24, the eMMC 2000 may include at least one NAND flash memory device 2100 and a controller 2200.

As described in FIGS. 1 through 21, the NAND flash memory device 2100 can be embodied to include an offset pulse in a word line voltage Vw1. The memory controller 2200 is connected to the NAND flash memory device 2100 through a plurality of channels. The controller 2200 includes at least one controller core 2210, a host interface 2250 and a NAND interface 2260. The controller core 2210 controls an overall operation of the eMMC 2000. The host interface 2250 performs an interface between the controller 2210 and a host. The NAND interface 2260 performs an interface between the NAND flash memory device 2100 and the controller 2200. The host interface 2250 may be a parallel interface (e.g., a MMC interface). The host interface 2250 of the eMMC 2000 may be a serial interface (e.g., UHS-II, UFS interface). The host interface 2250 may be a NAND interface.

The eMMC 2000 is provided with power supply voltages Vcc and Vccq from the host. A first power supply voltage Vcc (e.g., 3.3V) is provided to the NAND flash memory device 1100 and the NAND interface 1230. A second power supply voltage Vccq (e.g., 1.8V/3.3V) is provided to the controller 1200. The eMMC 2000 can be optionally provided with an external high voltage Vpp.

The eMMC 2000 can control a level and time of an offset pulse on the basis of environmental information to improve a program/read speed.

Figure 25:
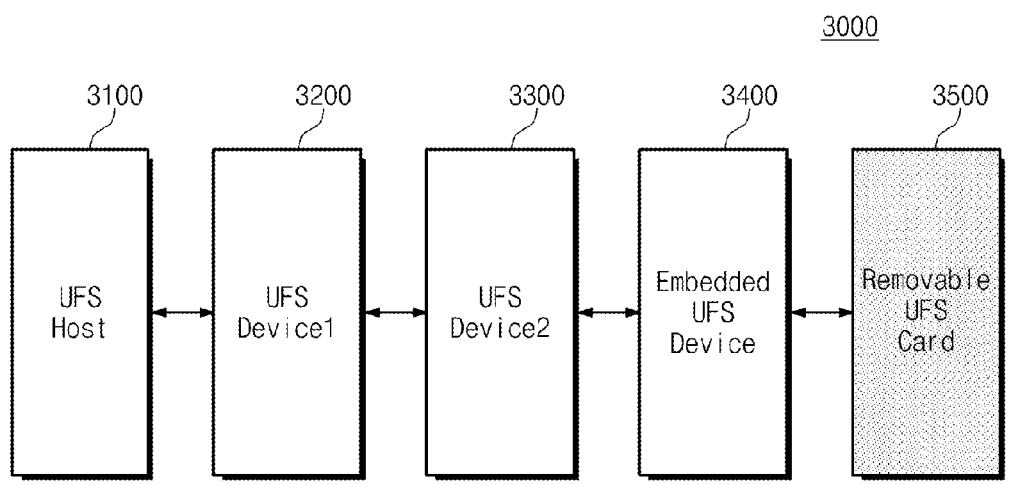

The inventive concept can be applied to a universal flash storage (UFS). FIG. 25 is a block diagram illustrating a UFS system in accordance with an embodiment of the inventive concept. Referring to FIG. 25, the UFS system 3000 may include a UFS host 3100, UFS devices 3200 and 3300, an embedded UFS device 3400 and a removal UFS card 3500. The UFS host 3100 may be an application processor of a mobile device. The UFS host 3100, the UFS devices 3200 and 3300, the embedded UFS device 3400 and the removal UFS card 3500 can communicate with external devices using a UFS protocol. At least one of the UFS devices 3200 and 3300, the embedded UFS device 3400 and the removal UFS card 3500 can be embodied by the storage device 10 illustrated in FIG. 21.

The embedded UFS device 3400 and the removal UFS card 3500 can communicate using a different protocol from the UFS protocol. The UFS host 3100 and the removal UFS card 3500 can communicate using various protocols (for example, UFDs, MMC, SD, mini SD, micro SD).

Figure 26:
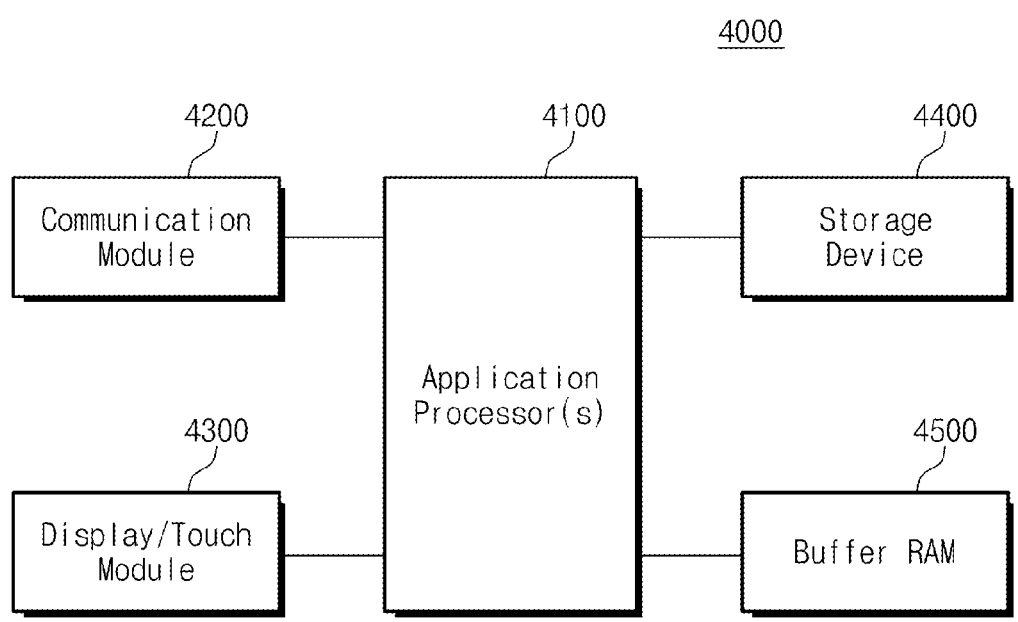

The inventive concept can be applied to a mobile device. FIG. 26 is a block diagram illustrating a mobile device 4000 in accordance with an embodiment of the inventive concept. Referring to FIG. 26, the mobile device 4000 includes an application processor 4100, a communication module 4200, a display/touch module 4300, a storage device 4400 and a mobile RAM 4500.

The application processor 4100 controls an overall operation of the mobile device 4000. The communication module 4200 is embodied to control a wired/wireless communication with the outside. The display/touch module 4300 is embodied to display data processed in the application processor 4100 or receive data from the touch panel. The storage device 4400 is embodied to store user data. The storage device 4400 may be an eMMC, a SSD or a UFS. The storage device 4400, as described in FIGS. 1 through 21, is embodied to control whether or not to apply an offset pulse and a level and time of the offset pulse. The mobile RAM 4500 is embodied to temporarily store data needed in a processing operation of the mobile device 4000.

The mobile device 4000 can improve systematic performance by including the storage device 4400 improving a program speed by greatly shortening a word line setting time.

The memory system or the storage device in accordance with exemplary embodiments of the inventive concept can be packaged according to any of various packaging technologies such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

As described above, the nonvolatile memory device and the word line driving method of the nonvolatile memory device can improve overall performance by applying an offset pulse having a level higher or lower than a target level to a word line to reduce a word line setting time.

Having described the exemplary embodiments of the inventive concept, it is further noted that it is readily apparent to those of reasonable skill in the art that various modifications may be made without departing from the spirit and scope of the inventive concept which is defined by the metes and bounds of the appended claims.

What is claimed is:

1. A nonvolatile memory device comprising:
   a memory cell array including a plurality of memory blocks having a plurality of strings formed in a direction perpendicular to a substrate and connected between bit lines and a common source line;
   an address decoder selecting one of the memory blocks in response to an address;
   an input/output circuit storing data to be programmed in memory cells connected to a selected word line among word lines of the selected memory block during a program operation or storing data read from memory cells connected to the selected word line during a read or verify operation;
   a voltage generation circuit generating word line voltages applied to the selected word line and unselected word lines; and a control logic controlling the address decoder, the input/
output circuit and the voltage generation circuit during
the program operation, the read operation and the
verify operation, wherein at least one of the word line voltages comprises
an offset pulse and a target pulse, the offset pulse
comprises an offset, such that when the target pulse is
a negative voltage, a level of the offset pulse is lower
than a level of the target pulse for at least a predetermined time, else when the target pulse is a positive
voltage, a level of the offset pulse is higher than a level
of the target pulse for at least a predetermined time.

2. The nonvolatile memory device of claim 1, wherein the voltage generation circuit selectively generates the offset pulse under the control of the control logic.

3. The nonvolatile memory device of claim 1, wherein at least one of the offset and the predetermined time of the offset pulse is changed in response to environmental information including at least one of a number of program loops, an operation mode, pass/fail information of a specific program state, state information, temperature information, a program/erase cycle, information about a degree of the number of operations, information about a physical structure of a word line, physical location information of a word line, address information, selection/non-selection information of a word line, and time information.

4. The nonvolatile memory device of claim 3, wherein during a consecutive read operation including a plurality of read voltages, offset pulses corresponding to the read voltages are applied for offset times before the read voltages are applied to the selected word line, such that offsets or the offset times of the offset pulses are differently set depending on corresponding read voltages.

5. The nonvolatile memory device of claim 3, wherein a first offset pulse is applied to the selected word line for a first offset time and a second offset pulse is applied to the unselected word lines for a second offset time longer than the first offset time.

6. The nonvolatile memory device of claim 1, wherein during the program operation, a program pulse applying a program voltage is applied after a pass voltage is applied to the selected word line, and
a first offset pulse is applied to the selected word line before the pass voltage is applied to the selected word line.

7. The nonvolatile memory device of claim 6, wherein a verify pulse including different verify voltages for verifying a plurality of states is applied after the program pulse is applied to the selected word line, and
each of offset pulses corresponding to the verify voltages has an offset and an offset time.

8. The nonvolatile memory device of claim 7, wherein at least one of the offset and offset time is set on the basis of pass/fail information corresponding to at least one of the plurality of states.

9. The nonvolatile memory device of claim 7, wherein at least one of the verify voltages is a negative voltage, and an offset pulse corresponding to the at least one of the verify voltages comprises an offset lower than a level of the at least one of the verify voltages.

10. The nonvolatile memory device of claim 6, wherein a second offset pulse is applied to the selected word line before the program voltage is applied to the selected word line.

11. A word line driving method for a nonvolatile memory device including a plurality of memory blocks having a plurality of strings formed in a direction perpendicular to a substrate and connected between bit lines and a common source line, the word line driving method comprising:
applying an offset pulse to a word line for a predetermined time; and
applying a target pulse having a level that is higher or lower than a level of the offset pulse to the word line after the predetermined time,
wherein the target pulse is one of a program voltage, a pass voltage, a read pass voltage, a read voltage and a verify voltage depending on an operation mode of the nonvolatile memory device, such that when the target pulse is a negative voltage, a level of the offset pulse is lower than a level of the target pulse for at least a predetermined time, else when the target pulse is a positive voltage, a level of the offset pulse is higher than a level of the target pulse for at least the predetermined time.

12. The word line driving method of claim 11, further comprising setting at least one of an offset and timing of the offset pulse in response to environmental information including at least one of a number of program loops, an operation mode, pass/fail information of a specific program state, state information, temperature information, a program/erase cycle, information about degree of the number of operations, information about a physical structure of a word line, physical location information of a word line, address information, selection/non-selection information of a word line, and time information.

13. The word line driving method of claim 11, further comprising determining whether or not to apply the offset pulse in response to the environmental information including at least one of a number of program loops, an operation mode, pass/fail information of a specific program state, state information, temperature information, a program/erase cycle, information about degree of the number of operations, information about a physical structure of a word line, physical location information of a word line, address information, selection/non-selection information of a word line, and time information.

14. The word line driving method of claim 11, wherein when the operation mode is a program operation mode, the word line is a selected word line.

15. A storage device comprising:
at least one nonvolatile memory device generating a word line voltage having an offset pulse and a target pulse; and
a memory controller controlling the at least one nonvolatile memory device,
wherein when the target pulse is a negative voltage, a level of the offset pulse is lower than a level of the target pulse for at least a predetermined time, else when the target pulse is a positive voltage, level of the offset pulse is higher than a level of the target pulse for at least a predetermined time.

16. The storage device of the claim 15, wherein the word line voltage is applied to a selected word line.

17. The storage device of the claim 15, wherein the word line voltage is applied to unselected word lines.

18. The storage device of the claim 15, wherein the at least one nonvolatile memory device includes a plurality of memory blocks having a plurality of strings formed in a direction perpendicular to a substrate and connected between bit lines and a common source line.

19. The storage device of the claim 15, wherein the memory controller generates offset pulse setting information in response to environmental information including at least one of a number of program loops, an operation mode, pass/fail information of a specific program state, state information, temperature information, a program/erase cycle, information about degree of the number of operations, information about a physical structure of a word line, physical location information of a word line, address information, selection/non-selection information of a word line, and time information, and
    an offset corresponding to a difference between the level of the offset pulse and the level of the target pulse, and the predetermined time are changed in response to the offset pulse setting information.

\* \* \* \* \*